US008698138B2

(12) United States Patent
Yamazaki

(10) Patent No.: US 8,698,138 B2
(45) Date of Patent: Apr. 15, 2014

(54) OXIDE SEMICONDUCTOR FILM ON AMORPHOUS INSULATING SURFACE

(71) Applicant: Semiconductor Energy Laboratory Co., Ltd., Atsugi (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/713,385

(22) Filed: Dec. 13, 2012

(65) Prior Publication Data

US 2013/0099234 A1 Apr. 25, 2013

Related U.S. Application Data

(63) Continuation of application No. 12/951,243, filed on Nov. 22, 2010, now Pat. No. 8,367,489.

(30) Foreign Application Priority Data

Nov. 28, 2009 (JP) ................................ 2009-270854

(51) Int. Cl.
H01L 29/10 (2006.01)
H01L 21/84 (2006.01)

(52) U.S. Cl.
USPC ............... 257/43; 257/57; 257/66; 257/328; 257/E51.005; 257/E29.117; 257/E29.273; 438/149; 438/151; 438/268

(58) Field of Classification Search
None
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,064,091 | A * | 5/2000 | Deane et al. ............ 257/347 |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |

(Continued)

FOREIGN PATENT DOCUMENTS

| EP | 1 737 044 A | 12/2006 |
| EP | 2 226 847 A | 9/2010 |

(Continued)

OTHER PUBLICATIONS

International Search Report (Application No. PCT/JP2010/070249) Dated Jan. 18, 2011.

(Continued)

*Primary Examiner* — Alonzo Chambliss
(74) *Attorney, Agent, or Firm* — Eric J. Robinson; Robinson Intellectual Property Law Office, P.C.

(57) ABSTRACT

Objects are to provide a semiconductor device for high power application in which a novel semiconductor material having high productivity is used and to provide a semiconductor device having a novel structure in which a novel semiconductor material is used. The present invention is a vertical transistor and a vertical diode each of which has a stacked body of an oxide semiconductor in which a first oxide semiconductor film having crystallinity and a second oxide semiconductor film having crystallinity are stacked. An impurity serving as an electron donor (donor) which is contained in the stacked body of an oxide semiconductor is removed in a step of crystal growth; therefore, the stacked body of an oxide semiconductor is highly purified and is an intrinsic semiconductor or a substantially intrinsic semiconductor whose carrier density is low. The stacked body of an oxide semiconductor has a wider band gap than a silicon semiconductor.

21 Claims, 20 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,429,823 B2 | 9/2008 | Yamamoto et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,935,964 B2 | 5/2011 | Kim et al. |
| 7,994,500 B2 | 8/2011 | Kim et al. |
| 8,148,779 B2 | 4/2012 | Jeong et al. |
| 8,188,480 B2 | 5/2012 | Itai |
| 8,203,143 B2 | 6/2012 | Imai |
| 8,236,627 B2 | 8/2012 | Tsubuku et al. |
| 8,367,489 B2 * | 2/2013 | Yamazaki .................. 438/156 |
| 2001/0046027 A1 | 11/2001 | Tai et al. |
| 2002/0042170 A1 * | 4/2002 | Yamazaki et al. ............ 438/151 |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0068852 A1 | 3/2011 | Yamazaki et al. |
| 2011/0101356 A1 * | 5/2011 | Yamazaki ...................... 257/59 |
| 2011/0127521 A1 | 6/2011 | Yamazaki |
| 2011/0127523 A1 | 6/2011 | Yamazaki |
| 2011/0127579 A1 | 6/2011 | Yamazaki |
| 2011/0133191 A1 | 6/2011 | Yamazaki |
| 2011/0193083 A1 | 8/2011 | Kim et al. |
| 2011/0284848 A1 | 11/2011 | Yamazaki |
| 2012/0052624 A1 | 3/2012 | Yamazaki |
| 2012/0064665 A1 | 3/2012 | Yamazaki |
| 2012/0261657 A1 * | 10/2012 | Takahashi et al. ............... 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-296378 | 12/1988 |
| JP | 05-251705 A | 9/1993 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-110110 | 4/2003 |
| JP | 2003-298062 A | 10/2003 |
| JP | 2004-103957 A | 4/2004 |
| JP | 2004-273614 A | 9/2004 |
| JP | 2004-273732 A | 9/2004 |
| JP | 2006-165527 | 6/2006 |
| JP | 2006-165528 | 6/2006 |
| JP | 2006-165529 | 6/2006 |
| JP | 2009-231613 | 10/2009 |
| JP | 2010-016347 | 1/2010 |
| JP | 2010-067954 | 3/2010 |
| WO | WO 2004/114391 | 12/2004 |
| WO | WO 2006/051993 | 5/2006 |

OTHER PUBLICATIONS

Written Opinion (Application No. PCT/JP2010/070249) Dated Jan. 18, 2011.

Nakayama et al., "17a-TL-8 Effect of GaO Layer on IGZO-TFT Channel," Extended Abstracts (The 57th Spring Meeting 2010), The

(56) References Cited

OTHER PUBLICATIONS

Japan Society of Applied Physics and Related Societies, Mar. 17, 2010, pp. 21-008.

Fortunato et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$=3, 4, and 5), $InGaO_3(ZnO)_3$, and $Ga_2O_3(ZnO)m$ ($m$=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds In$MO_3$(ZnO)$m$ ($M$=In,Ga; $m$=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the 16$^{th}$ International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

(56) References Cited

OTHER PUBLICATIONS

Ohara et al., "21.3: 4.0 Iin. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," Nirim Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent InGaZnO4," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the $6^{th}$ International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

\* cited by examiner

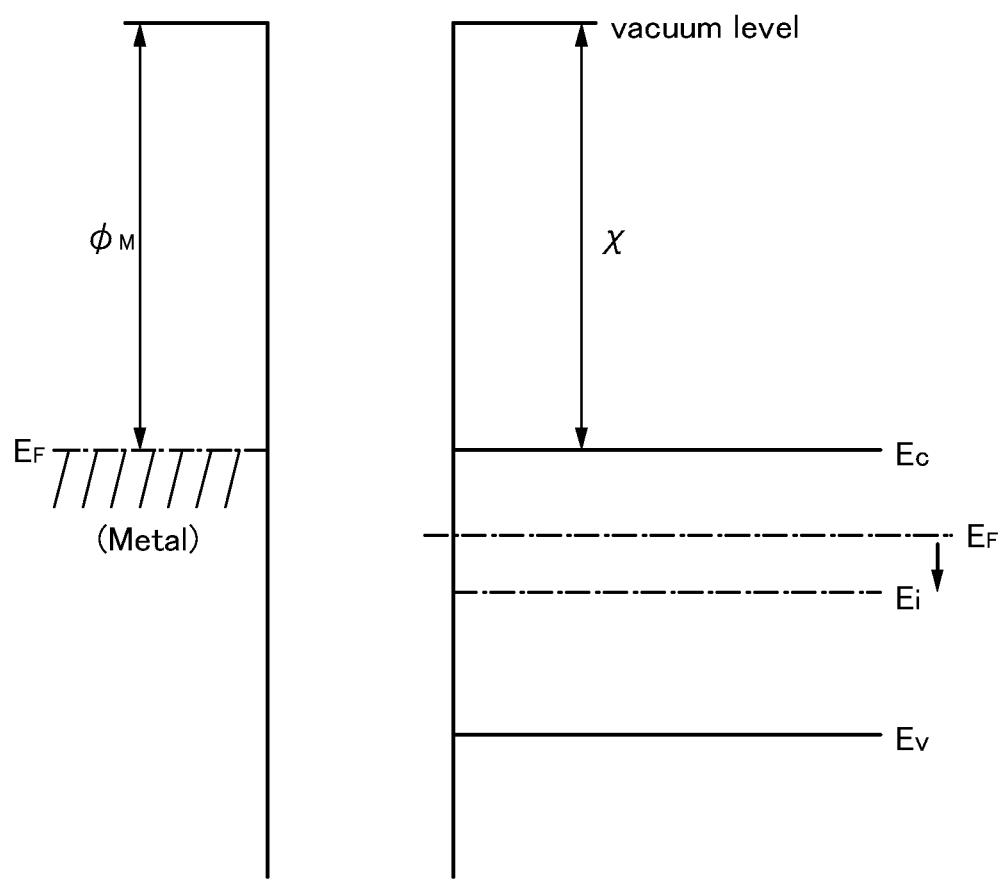

3 nm protective film c-axis

OS

SiON

FIG. 20A
FIG. 20B
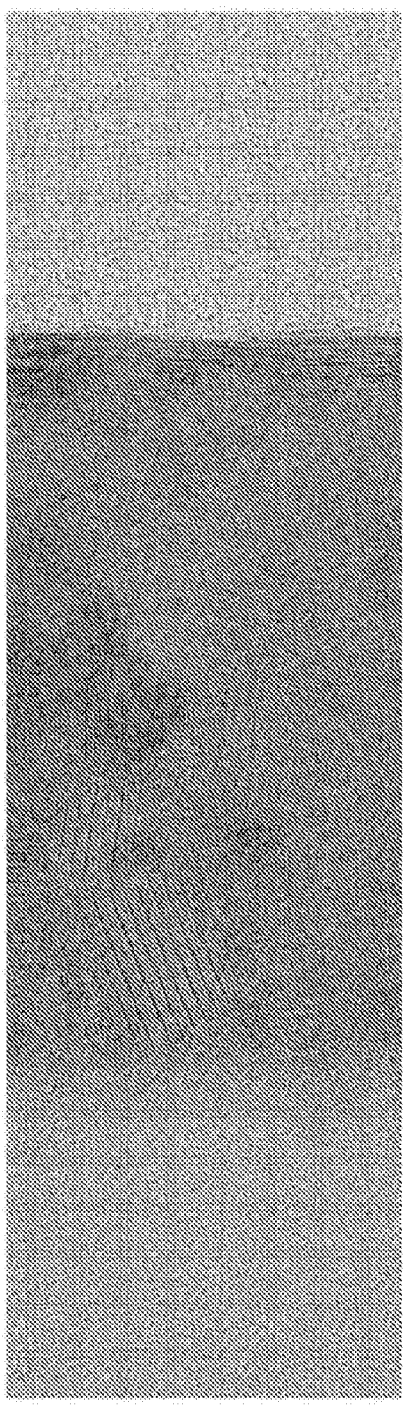
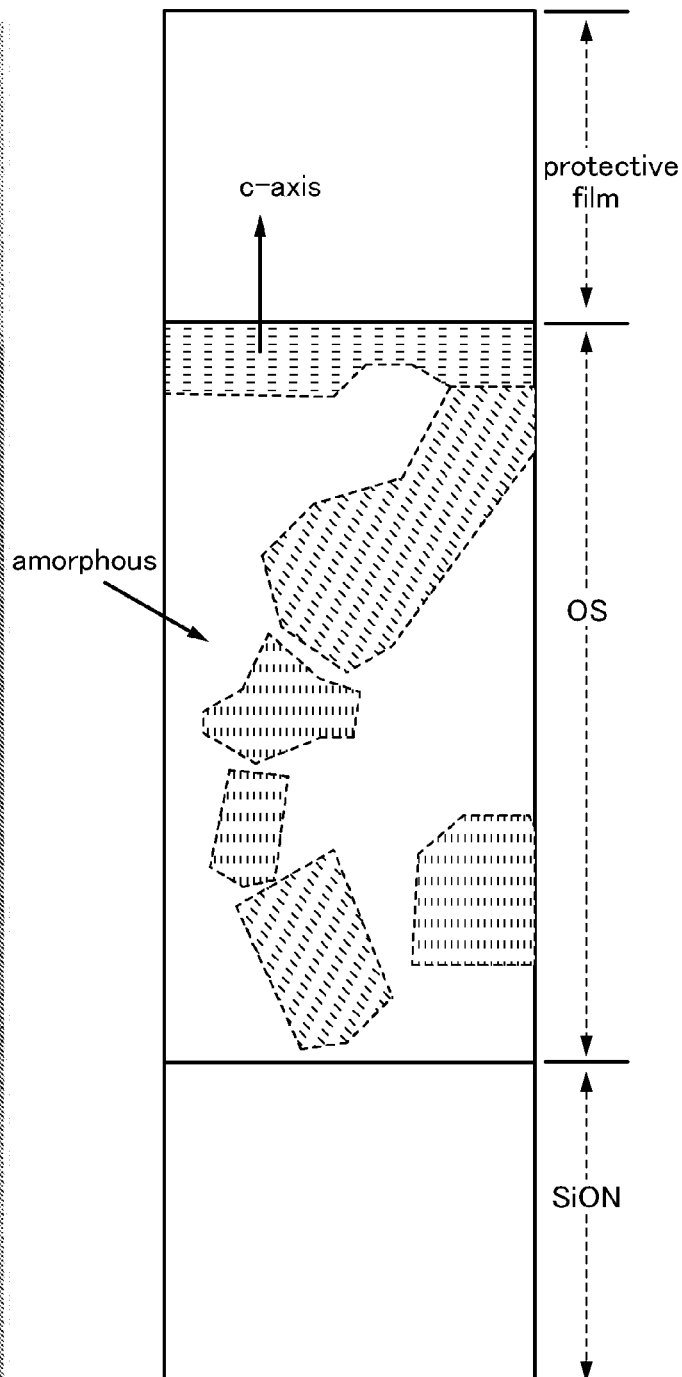

OXIDE SEMICONDUCTOR FILM ON AMORPHOUS INSULATING SURFACE

TECHNICAL FIELD

The present invention relates to a semiconductor device which has a semiconductor element using an oxide semiconductor and a manufacturing method of the semiconductor device.

BACKGROUND ART

A technique of forming a thin film transistor (TFT) by using a thin semiconductor film formed at a relatively low temperature over a substrate having an insulating surface has attracted attention. A thin film transistor is used for a display device typified by a liquid crystal television. A silicon-based semiconductor material is known as a material for a semiconductor thin film applicable to a thin film transistor. Other than a silicon-based semiconductor material, an oxide semiconductor has attracted attention.

As a material for the oxide semiconductor, zinc oxide and a material containing zinc oxide as its component are known. Further, a thin film transistor formed using an amorphous oxide (an oxide semiconductor) having an electron carrier density lower than $10^{18}$ cm$^{-3}$ is disclosed (Patent Documents 1 to 3).

REFERENCES

Patent Documents

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

In the case of a transistor used in a semiconductor device for high power application, characteristics such as high withstand voltage, high conversion efficiency, and high-speed switching are needed. Silicon is used for a semiconductor material of such a semiconductor device; however, from the above-described point of view, a novel semiconductor material which can further improve the characteristics is required.

As an example of a semiconductor material which can improve the above characteristics, silicon carbide can be given. Since silicon carbide has a small interatomic distance of approximately 0.18 nm in a Si—C bond, a high bond energy, and a large band gap which is about three times that of silicon, it is known that silicon carbide is advantageous in increasing the withstand voltage of a semiconductor device, reducing a loss of electric power, and the like.

However, it is difficult to melt silicon carbide because of its characteristics; therefore, silicon carbide cannot be manufactured by a method having high productivity such as a Czochralski (CZ) method or the like which is used for manufacturing a silicon wafer. Moreover, there is also a problem in that silicon carbide has defects called micropipes. Because of these problems, commercialization of a semiconductor device using silicon carbide is delayed.

In view of the foregoing problems, an object of one embodiment of the disclosed invention is to provide a semiconductor device for high power application in which a novel semiconductor material having high productivity is used. Another object of one embodiment of the disclosed invention is to provide a semiconductor device having a novel structure in which a novel semiconductor material is used.

In one embodiment of the present invention, a first oxide semiconductor film is formed over a first electrode which is formed over a substrate; then, crystal growth is caused from a surface to the inside portion of the first oxide semiconductor film by performing heat treatment at a temperature higher than or equal to 450° C. and lower than or equal to 850° C., preferably higher than or equal to 550° C. and lower than or equal to 750° C. so that a first oxide semiconductor film having crystallinity which is in contact with the first electrode is formed; and a second oxide semiconductor film having crystallinity is stacked over the first oxide semiconductor film having crystallinity. Note that each of the first oxide semiconductor films having crystallinity and the second oxide semiconductor film having crystallinity has a flat-plate-shaped polycrystalline region having uniform crystal alignment on the surface thereof. The flat-plate-shaped polycrystalline region is c-axis aligned in a direction perpendicular to the surface of the first oxide semiconductor film having crystallinity and the second oxide semiconductor film having crystallinity. Note that elements which are adjacent to each other in the a-b plane are of the same kind. The c-axis direction of each of the first oxide semiconductor film having crystallinity and the second oxide semiconductor film corresponds to the direction perpendicular to the surface.

The second oxide semiconductor film having crystallinity can be formed in the following manner: a second oxide semiconductor film is formed over the first oxide semiconductor film having crystallinity; and then, heat treatment at a temperature higher than or equal to 450° C. and lower than or equal to 850° C., preferably higher than or equal to 550° C. and lower than or equal to 750° C. is performed so that crystal growth is caused toward the surface of the second oxide semiconductor film which is in an upper level than the surface of the first oxide semiconductor film having crystallinity. That is, the first oxide semiconductor film having crystallinity has a function of a seed crystal for the second oxide semiconductor film.

Further, the second oxide semiconductor film having crystallinity is deposited over the first oxide semiconductor film having crystallinity while heating is performed at a temperature higher than or equal to 200° C. and lower than or equal to 550° C. Typically, deposition is performed by a sputtering method, so that epitaxial growth or axial growth from the surface of the first oxide semiconductor film having crystallinity is caused and the second oxide semiconductor film having crystallinity is formed. That is, the first oxide semiconductor film having crystallinity has a function of a seed crystal for the second oxide semiconductor film.

Since the crystal growth is caused with the use of the first oxide semiconductor film having crystallinity as a seed crystal, the second oxide semiconductor film having crystallinity has substantially the same crystal alignment as the first oxide semiconductor film having crystallinity.

After that, the first and second oxide semiconductor films are etched to have an island shape; a second electrode is formed over the second oxide semiconductor film; and a gate insulating film and a third electrode functioning as a gate electrode are formed, whereby a vertical transistor, a vertical diode, or the like can be manufactured as a semiconductor element. Note that the first electrode functions as one of a source electrode and a drain electrode and the second electrode functions as the other of the source electrode and the drain electrode.

The heat treatment (first heat treatment) for forming the first oxide semiconductor film having crystallinity and the heat treatment (second heat treatment) for forming the second oxide semiconductor film having crystallinity are preferably performed in an atmosphere containing almost no hydrogen and moisture (e.g., a nitrogen atmosphere, an oxygen atmosphere, or a dry-air atmosphere). By the first heat treatment and the second heat treatment, dehydration or dehydrogenation by which H, OH, H$_2$O, or the like is eliminated from the first oxide semiconductor film is performed, whereby the first oxide semiconductor film having crystallinity and the second oxide semiconductor film having crystallinity can be highly purified. In addition, the first heat treatment and the second heat treatment can be performed in the following manner: the temperature is increased in an inert gas atmosphere and then the atmosphere is switched to an atmosphere containing oxygen. In the case where the heat treatment is performed in the oxygen atmosphere, the oxide semiconductor film is oxidized, whereby an oxygen deficiency can be repaired. Even when measurement using thermal desorption spectroscopy (also referred to as TDS) at up to 450° C. is performed on the first oxide semiconductor film having crystallinity subjected to the first heat treatment, at least a peak at around 300° C. of two peaks of water is not detected.

Note that in the case where the first oxide semiconductor film having crystallinity and the second oxide semiconductor film having crystallinity contain In, in their flat-plate-shaped polycrystalline region, mobility is increased because electron clouds of In overlap with each other to be connected to each other. Therefore, high field-effect mobility can be realized in a transistor which includes an oxide semiconductor film having a polycrystalline region in a channel.

There is no particular limitation on a material of the first oxide semiconductor film having crystallinity and that of the second oxide semiconductor film having crystallinity and different materials may be used or materials that contain the same components may be used as long as a polycrystalline region which is c-axis aligned in a direction perpendicular to the surface can be obtained. Note that when different materials are used, heteroepitaxial growth is caused and a heteroepitaxial structure is obtained.

When an oxide semiconductor material used for forming the first oxide semiconductor film having crystallinity and that used for forming the second oxide semiconductor film having crystallinity contain the same main components, a boundary between the first oxide semiconductor film having crystallinity and second oxide semiconductor film having crystallinity may become unclear and a substantially single-layer structure may be obtained. Note that when materials that contain the same components are used, homoepitaxial growth is caused and a homoepitaxial structure is obtained.

Note that since a polycrystalline region having uniform crystal alignment which is formed at the surface of the first oxide semiconductor film having crystallinity grows in a depth direction from the surface, the first oxide semiconductor film can be formed without being affected by a base member of the first oxide semiconductor film having crystallinity in the case where the first oxide semiconductor film is amorphous just after being deposited.

A vertical transistor and a vertical diode each of which is one embodiment of the present invention have a stacked body of an oxide semiconductor in which the first oxide semiconductor film having crystallinity and the second oxide semiconductor film having crystallinity are stacked. An impurity serving as an electron donor (donor) which is contained in the stacked body of an oxide semiconductor is removed in a step of the crystal growth; therefore, the stacked body of an oxide semiconductor is highly purified and is formed using an intrinsic semiconductor or a substantially intrinsic semiconductor whose carrier density is low. In addition, the stacked body of an oxide semiconductor has a wider band gap than a silicon semiconductor.

In the highly purified stacked body of an oxide semiconductor, hydrogen concentration is lower than or equal to $1 \times 10^{18}$ cm$^{-3}$, preferably lower than or equal to $1 \times 10^{16}$ cm$^{-3}$, more preferably substantially 0; carrier density is lower than $1 \times 10^{12}$ cm$^{-3}$, preferably lower than $1.45 \times 10^{10}$ cm$^{-3}$, which is lower than the lower limit of measurement; and a band gap is greater than or equal to 2 eV, preferably greater than or equal to 2.5 eV, more preferably, greater than or equal to 3 eV.

By using such a highly purified stacked body of an oxide semiconductor in a channel formation region of a transistor, a channel can be formed not only at a surface of the stacked body of an oxide semiconductor which is in contact with a gate insulating film but also the inside portion of the stacked body of an oxide semiconductor, i.e., a channel can be formed in the whole stacked body of an oxide semiconductor; thus, a large amount of current can flow in the transistor in an on state. When the transistor is in an off state, a depletion layer spreads to a deeper region inside the stacked body of an oxide semiconductor, whereby off-state current that is current flowing in a transistor in an off state can be reduced. Further, withstand voltage becomes higher and hot-carrier degradation is suppressed so that a semiconductor device for high power application to which a high voltage is applied can be manufactured.

By using such a highly purified stacked body of an oxide semiconductor in a diode, the diode has high rectification property.

Note that a transistor according to one embodiment of the present invention includes an insulated-gate field-effect transistor (IGFET) and a power MOSFET in its category.

According to one embodiment of the present invention, by using an oxide semiconductor film in which hydrogen concentration is reduced and the purity is increased and which has a polycrystalline region, a transistor and a diode can operate favorably. In a transistor, particularly, withstand voltage can be higher, a short channel effect can be reduced, and a high on-off ratio can be obtained. Therefore, a semiconductor device for high power application can be manufactured by using this transistor.

BRIEF DESCRIPTION OF DRAWINGS

In the accompanying drawings:

FIG. 4 is a diagram illustrating a relation between a vacuum level and a work function ($\phi_M$) of metal and a relation between the vacuum level and an electron affinity ($\chi$) of an oxide semiconductor;

FIGS. 20A and 20B are a TEM photograph and a schematic diagram of a cross section of an oxide semiconductor film.

BEST MODE FOR CARRYING OUT THE INVENTION

Figure 1A:
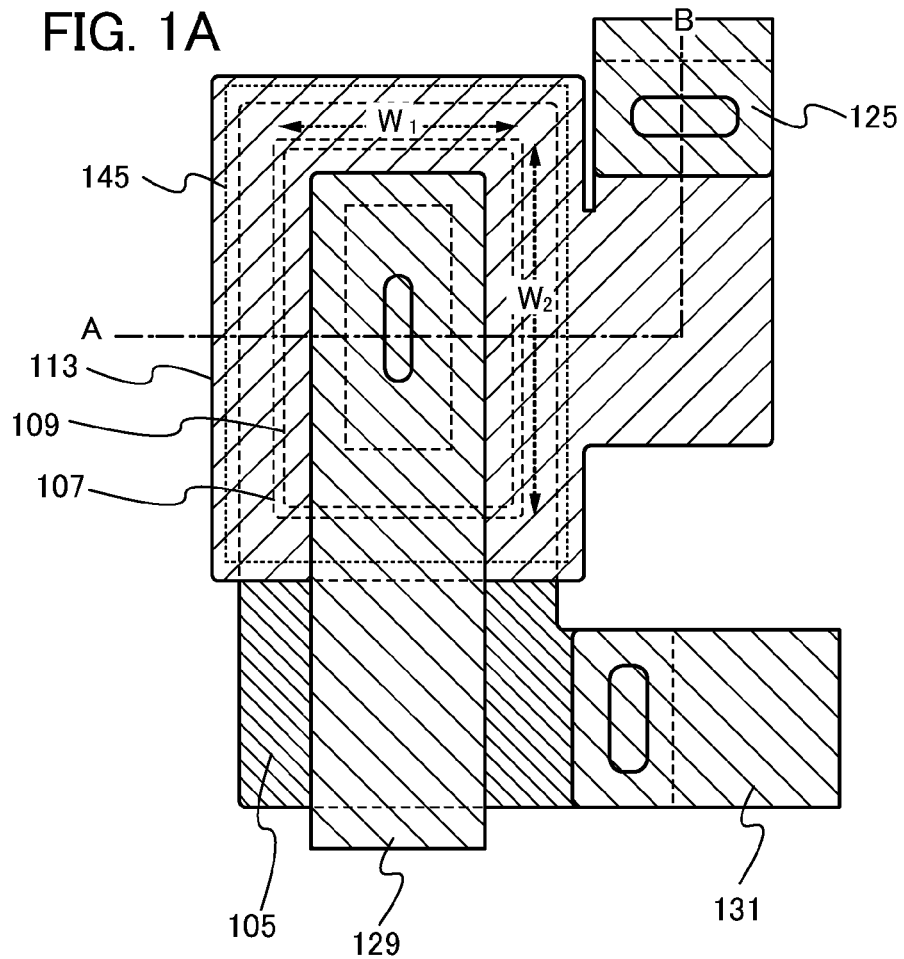
FIGS. 1A and 1B are a top view and a cross-sectional view illustrating a transistor.

Embodiments of the present invention will be described below with reference to the accompanying drawings. However, the present invention is not limited to the description below, and it is easily understood by those skilled in the art that modes and details disclosed herein can be modified in various ways without departing from the spirit and scope of the present invention. Therefore, the present invention should not be interpreted as being limited to description in the embodiments below. Note that in structures of the present invention described hereinafter, like portions or portions having similar functions are denoted by the same reference numerals in different drawings, and description thereof is not repeated.

Note that in each drawing described in this specification, the size of each component or the thickness of each layer or an area is exaggerated in some cases for clarification. Therefore, embodiments of the present invention are not limited to such scales.

Note that the numeral terms such as "first", "second", and "third" in this specification are used in order to avoid confusion between components and do not set a limitation on number. Therefore, for example, the term "first" can be replaced with the term "second", "third", or the like as appropriate.

Note that "voltage" indicates a difference between potentials of two points, and "potential" indicates electrostatic energy (electrical potential energy) of a unit charge at a given point in an electrostatic field. Note that in general, a difference between potential of one point and a reference potential is merely called potential or voltage, and potential and voltage are used as synonymous words in many cases. Thus, in this specification, potential may be rephrased as voltage and voltage may be rephrased as potential unless otherwise specified.

Embodiment 1

In this embodiment, a structure of a transistor, which is an embodiment of a semiconductor element, will be described with reference to FIGS. 1A and 1B.

Figure 1B:
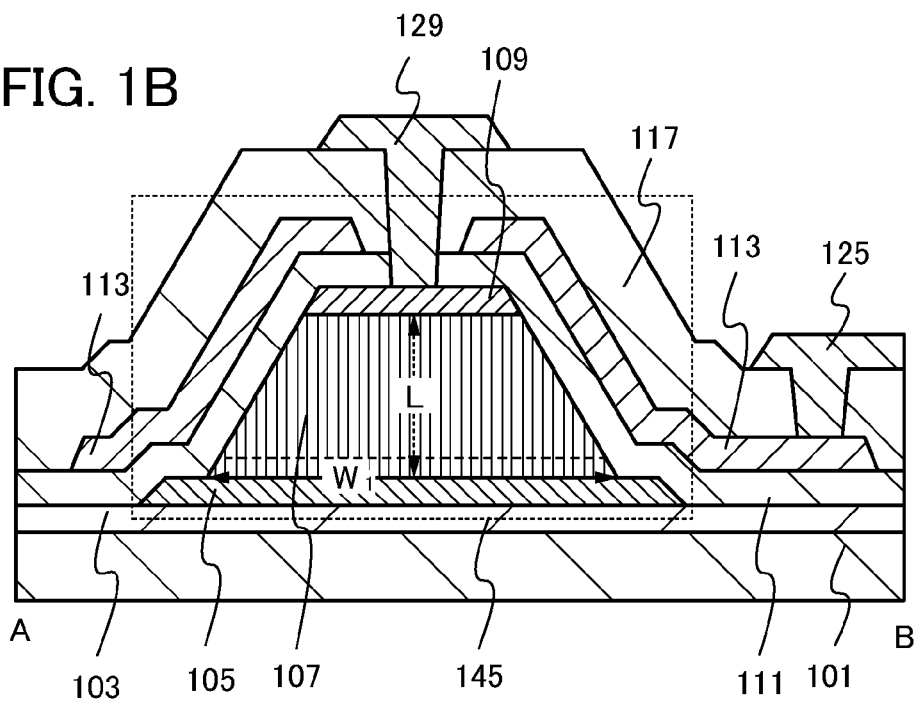

FIG. 1A is a top view of a transistor 145, and FIG. 1B corresponds to a cross-sectional view taken along dashed line A-B in FIG. 1A.

As illustrated in FIG. 1B, a first electrode 105, an oxide semiconductor film 107 which has a polycrystalline region, and a second electrode 109 are stacked over an insulating film 103 formed over a substrate 101. Note that the second electrode 109 is stacked over and in contact with the entire top surface of the oxide semiconductor film 107. A gate insulating film 111 is provided so as to cover the first electrode 105, the oxide semiconductor film 107, and the second electrode 109. Over the gate insulating film 111, a third electrode 113 facing at least a side surface of the oxide semiconductor film is provided. An insulating film 117 functioning as an interlayer insulating film is provided over the gate insulating film 111 and the third electrode 113. Openings are formed in the insulating film 117, and a wiring 131 (see FIG. 1A) connected through the opening to the first electrode 105, a wiring 129 connected through the opening to the second electrode 109, and a wiring 125 connected through the opening to the third electrode 113 are formed. Note that in this specification a top surface of a film means a surface out of a pair of surfaces parallel to the substrate 101 which is far from the substrate 101.

The first electrode 105 functions as one of a source electrode and a drain electrode of the transistor 145. The second electrode 109 functions as the other of the source electrode and the drain electrode of the transistor 145. The third electrode 113 functions as a gate electrode of the transistor 145.

In this embodiment, the oxide semiconductor film 107 has crystallinity and has a flat-plate-shaped polycrystalline region in which crystal alignment is uniform at a surface thereof. That is, the polycrystalline region of the oxide semiconductor film 107 has the a-b plane which is parallel to the surface and is c-axis aligned in a direction perpendicular to the surface. In other words, the c-axis direction of the oxide semiconductor film 107 corresponds to the direction perpendicular to the surface. Note that elements which are adjacent to each other in the a-b plane are of the same kind. Note that the flat-plate-shaped polycrystalline region is a region which has a plurality of single crystal regions in each of which c-axis is aligned in the direction perpendicular to the surface.

In the polycrystalline region, electron clouds of In overlap with each other to be connected to each other, whereby electrical conductivity σ is improved. Therefore, high field-effect mobility can be realized in a transistor which includes an oxide semiconductor film having a polycrystalline region.

The oxide semiconductor film 107 is formed using metal oxide and any one of the following metal oxide films can be used: a four-component metal oxide film such as an In—Sn—Ga—Zn—O film; a three-component metal oxide film such as an In—Ga—Zn—O film, an In—Sn—Zn—O film, an In—Al—Zn—O film, a Sn—Ga—Zn—O film, an Al—Ga—Zn—O film, and a Sn—Al—Zn—O film; a two-component metal oxide film such as an In—Zn—O film, a Sn—Zn—O film, an Al—Zn—O film, a Zn—Mg—O film, a Sn—Mg—O film, and an In—Mg—O film; an In—O film; a Sn—O film; and a Zn—O film.

For the oxide semiconductor film 107, a material expressed by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

Note also that the oxide semiconductor film 107 may be formed using an oxide semiconductor material represented by In-A-B—O. Here, A represents one or more kinds of elements selected from Group 13 elements such as gallium (Ga) and aluminum (Al), Group 14 elements such as silicon (Si) and germanium (Ge), and the like. B represents one or more kinds of elements selected from Group 12 elements such as zinc (Zn). It is to be noted that values of an In content, an A content, and a B content are arbitrary. The value of the A content may be 0. On the other hand, the value of the In content and that of the B content are not 0. In other words, the above expression may represent In—Ga—Zn—O, In—Zn—O, and the like.

In the case where the oxide semiconductor film 107 has a crystal structure represented by $In_2Ga_2ZnO_7$, or $InGaZnO_4$, it can be understood that the oxide semiconductor film 107 contains any of In, Ga, and Zn and has a stacked-layer structure of layers parallel to the a-axis and b-axis. Since electrical conductivity of the crystals of $InGaZnO_4$ or $In_2Ga_2ZnO_7$ are controlled mainly by In, electrical characteristics of a layer containing In which are related to a direction parallel to the a-axis and b-axis are preferable. In the crystals of $InGaZnO_4$ or $In_2Ga_2ZnO_7$, electron clouds of In overlap with each other to be connected to each other so that a carrier path is formed.

In other words, crystallization is caused more easily in the a-b plane direction than in the c-axis direction. Further, in the flat-plate-shaped polycrystalline region, the a-b planes of the single crystal regions become parallel to the surface. In addition, a free space is located above the surface of the oxide semiconductor film 107, in which crystals do not grow upward. These can be inferred from the fact that when an In—Ga—Zn—O film as the oxide semiconductor film 107 was measured with thermal desorption spectroscopy (TDS) while the temperature was increased to 450° C., peaks of In and Ga were not detected but a peak of zinc was detected in a vacuum heating condition, particularly at around 300° C. Note that the TDS measurement was performed in a vacuum and it was observed that elimination of zinc was detected from around 200° C.

A conventional oxide semiconductor is generally an n-type semiconductor and current tends to flow between source and drain electrodes even when a gate voltage is 0 V in a transistor using an oxide semiconductor; that is, the transistor tends to be normally on. In the case where the transistor is normally on, it is difficult to control the circuit even when the field-effect mobility is high. Note that it is known that some hydrogen is a donor in an oxide semiconductor and is one factor causing an oxide semiconductor to be an n-type semiconductor. It is also known that some oxygen deficiency is a donor and is another factor causing an oxide semiconductor to be an n-type semiconductor.

Therefore, in order to make the oxide semiconductor film be an i-type oxide semiconductor film, the oxide semiconductor film is highly purified by removing hydrogen that is an n-type impurity from the oxide semiconductor film so as to contain an impurity that is not a main component of the oxide semiconductor film as little as possible and is made intrinsic (i-type) or substantially intrinsic by removing oxygen deficiency. In other words, a feature of one embodiment of the present invention is that a highly purified i-type (intrinsic) semiconductor, or a semiconductor close thereto, is obtained not by adding an impurity but by removing an impurity such as hydrogen or water or oxygen deficiency as much as possible. By highly purifying the oxide semiconductor film, the threshold voltage of the transistor can be positive and a so-called normally-off switching element can be obtained.

The hydrogen concentration in the oxide semiconductor film 107 here is lower than or equal to $1\times10^{18}$ cm$^{-3}$, preferably lower than or equal to $1\times10^{16}$ cm$^{-3}$, more preferably substantially 0. The carrier density of the oxide semiconductor film 107 is lower than $1\times10^{12}$ cm$^{-3}$, preferably lower than $1.45\times10^{10}$ cm$^{-3}$, which is lower than the lower limit of measurement. That is, the carrier density of the oxide semiconductor film is as close to zero as possible. A band gap is greater than or equal to 2 eV, preferably greater than or equal to 2.5 eV, more preferably greater than or equal to 3 eV. Note that the hydrogen concentration in the oxide semiconductor film can be measured by secondary ion mass spectrometry (SIMS). The carrier density can be measured by the Hall effect measurement. Lower carrier density can be calculated with the use of measurement results of capacitance-voltage (CV) measurement and Formula 1.

$$N_d = -\left(\frac{2}{e\varepsilon_0\varepsilon}\right) \bigg/ \frac{d(1/C)^2}{dV} \qquad \text{[Formula 1]}$$

The thickness of the oxide semiconductor film 107 is greater than or equal to 1 μm, preferably greater than or equal to 3 μm, more preferably greater than or equal to 10 μm, in which case a semiconductor device for high power application can be manufactured.

In this embodiment, the third electrode 113 functioning as the gate electrode has a ring shape. When the third electrode 113 functioning as the gate electrode has a ring shape, the channel width of the transistor can be increased. In the transistor of this embodiment, the channel length L means the thickness of the oxide semiconductor film and the channel width W is a length of an end portion of the oxide semiconductor film that is in contact with the first electrode or the second electrode. Note that in this embodiment, the length of the end portion of the oxide semiconductor film that is in contact with one of the first electrode and the second electrode which has a larger area than the other is W. In this embodiment, since the shape of the top surface of the oxide semiconductor film of the transistor is a rectangle with a side $W_1$ and a side $W_2$, the channel width W is the sum of $2W_1$ and $2W_2$. Note that in the case where the shape of the top surface of the oxide semiconductor film of the transistor is circular, the channel width W is $2\pi r$ where r is a radius of the circle.

The transistor of this embodiment has large on-state current because the oxide semiconductor film included therein has the polycrystalline region so that the whole oxide semiconductor film functions as a channel in an on state and more carriers transfer. Further, in the transistor of this embodiment, the intrinsic carrier density is extremely low and thus the maximum width of a depletion layer is extremely large, and the depletion layer spreads inside the oxide semiconductor film in an off state and off-state current is reduced. In other words, a high on-off ratio can be obtained in the transistor.

Note that a transistor is an element having at least three terminals: a gate, a drain, and a source. The transistor has a channel formation region between a drain region and a source region, and current can flow through the drain region, the channel formation region, and the source region. Here, since the source and the drain of the transistor are interchangeable depending on a structure, operating conditions, and the like of the transistor, it is difficult to define which is a source or a drain. Thus, a region which serves as a source and a drain is not referred to as a source or a drain in some cases. In such a case, one of the source and the drain may be referred to as a first terminal and the other thereof may be referred to as a second terminal, for example. Alternatively, one of the source and the drain may be referred to as a first electrode and the other thereof may be referred to as a second electrode. Alternatively, one of the source and the drain may be referred to as a first region and the other of the source and the drain may be referred to as a second region.

It is necessary that the substrate 101 have at least enough heat resistance to withstand heat treatment to be performed later. As the substrate 101, a glass substrate of barium borosilicate glass, aluminoborosilicate glass, or the like can be used.

As the glass substrate, in the case where the temperature of the heat treatment to be performed later is high, the one whose strain point is higher than or equal to 730° C. is preferably used. As the glass substrate, a glass material such as aluminosilicate glass, aluminoborosilicate glass, or barium borosilicate glass is used, for example. Note that a glass substrate containing BaO and $B_2O_3$ so that the amount of BaO is larger than that of $B_2O_3$ is preferably used.

Note that, instead of the glass substrate described above, a substrate formed using an insulator, such as a ceramic substrate, a quartz substrate, or a sapphire substrate, may be used. Alternatively, crystallized glass or the like may be used.

The insulating film 103 is formed using an oxide insulating film such as a silicon oxide film or a silicon oxynitride film; or a nitride insulating film such as a silicon nitride film, a silicon nitride oxide film, an aluminum nitride film, or an aluminum nitride oxide film. In addition, the insulating film 103 may have a stacked-layer structure, for example, a stacked-layer structure in which one or more of the nitride insulating films and one or more of the oxide insulating films are stacked in that order over the substrate 101. The thickness of the insulating film 103 is preferably greater than or equal to 100 nm and less than or equal to 2 µm.

The first electrode 105 and the second electrode 109 are formed using a metal element selected from aluminum, chromium, copper, tantalum, titanium, molybdenum, tungsten, and yttrium; an alloy containing any of these metal elements as a component; an alloy containing these metal elements in combination; or the like. Alternatively, one or more metal elements selected from manganese, magnesium, zirconium, beryllium, and thorium can be used. In addition, the first electrode 105 can have a single-layer structure or a stacked-layer structure having two or more layers. For example, a single-layer structure of an aluminum film containing silicon, a two-layer structure in which a titanium film is stacked over an aluminum film, a two-layer structure in which a titanium film is stacked over a tungsten film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The first electrode 105 and the second electrode 109 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure having a layer containing the above light-transmitting conductive material and a layer containing the above metal element.

The gate insulating film 111 can be formed to have a single-layer structure or a stacked-layer structure having a silicon oxide film, a silicon nitride film, a silicon oxynitride film, a silicon nitride oxide film, and/or an aluminum oxide film. A portion of the gate insulating film 111 which is in contact with the oxide semiconductor film 107 preferably contains oxygen, and it is particularly preferable that the portion of the gate insulating film 111 be formed using a silicon oxide film. By using a silicon oxide film, oxygen can be supplied to the oxide semiconductor film 107 and favorable characteristics can be obtained.

The gate insulating film 111 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current can be reduced. Further, a stacked-layer structure in which a high-k material and one or more of a silicon oxide film, a silicon nitride film, a silicon oxynitride film, a silicon nitride oxide film, and an aluminum oxide film are stacked can be used. The thickness of the gate insulating film 111 is preferably greater than or equal to 50 nm and less than or equal to 500 nm. The large thickness of the gate insulating film 111 makes it possible to reduce the gate leakage current.

The third electrode 113 functioning as a gate electrode is formed using a metal element selected from aluminum, chromium, copper, tantalum, titanium, molybdenum, and tungsten; an alloy containing any of these metal elements as a component; an alloy film containing these metal elements in combination; or the like. Further, one or more metal elements selected from manganese, magnesium, zirconium, and beryllium may be used. In addition, the third electrode 113 can have a single-layer structure or a stacked-layer structure having two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or a plurality of elements selected from titanium, tantalum, tungsten, molybdenum, chromium, neodymium, and scandium may be used.

The third electrode 113 functioning as the gate electrode can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Next, operation of the transistor including the oxide semiconductor film 107 will be described with reference to energy band diagrams.

Figure 2:
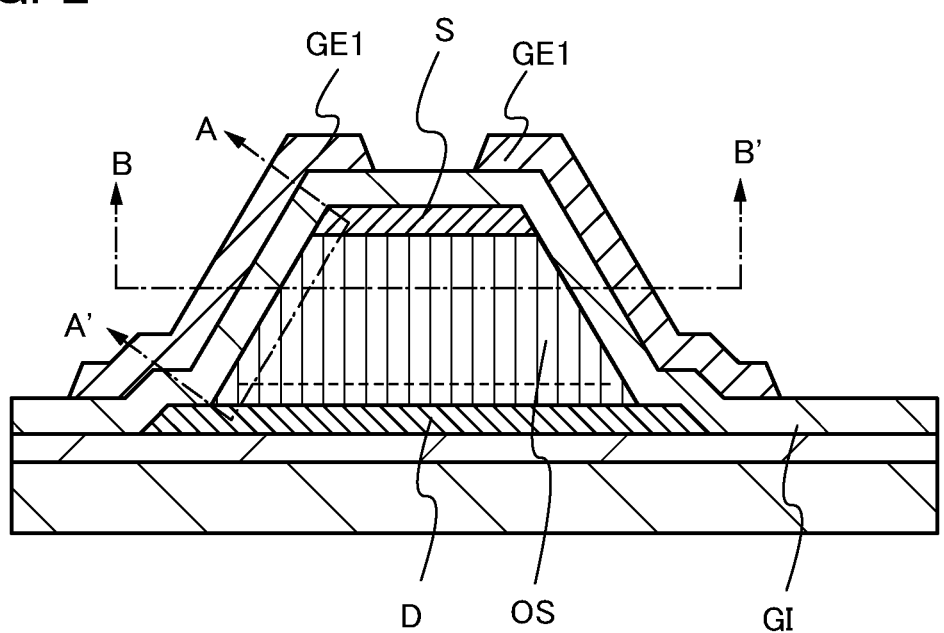
FIG. 2 is a longitudinal cross-sectional view of a vertical transistor using an oxide semiconductor.

FIG. 2 is a longitudinal cross-sectional view of a vertical transistor in which an oxide semiconductor is used. An oxide semiconductor film (OS) is provided over a drain electrode (D), and a source electrode (S) is provided over the oxide semiconductor film (OS). A gate insulating film (GI) is provided over the drain electrode, the oxide semiconductor film, and the source electrode, and a gate electrode (GE1) is provided thereover.

Figure 3A:
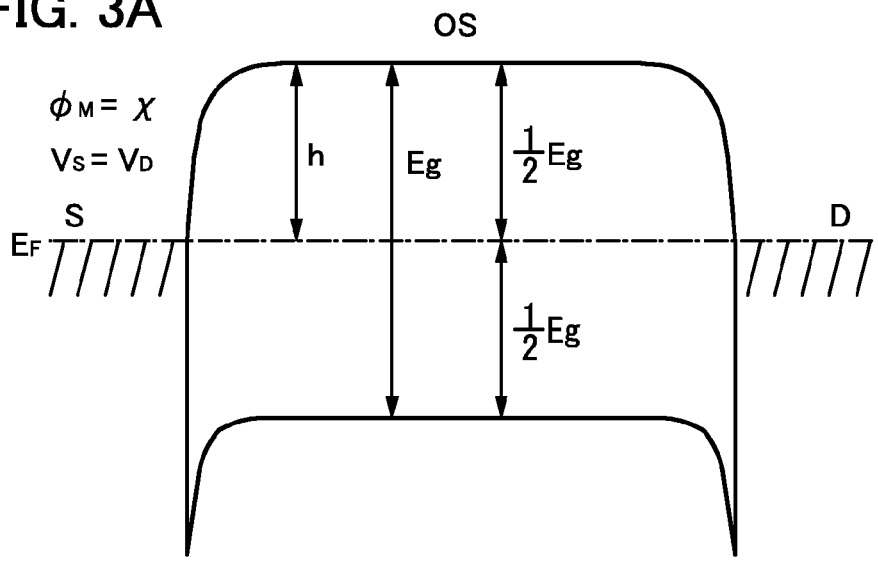
FIGS. 3A and 3B are energy band diagrams (schematic diagrams) of a cross section taken along line A-A' in FIG. 2.
Figure 3B:
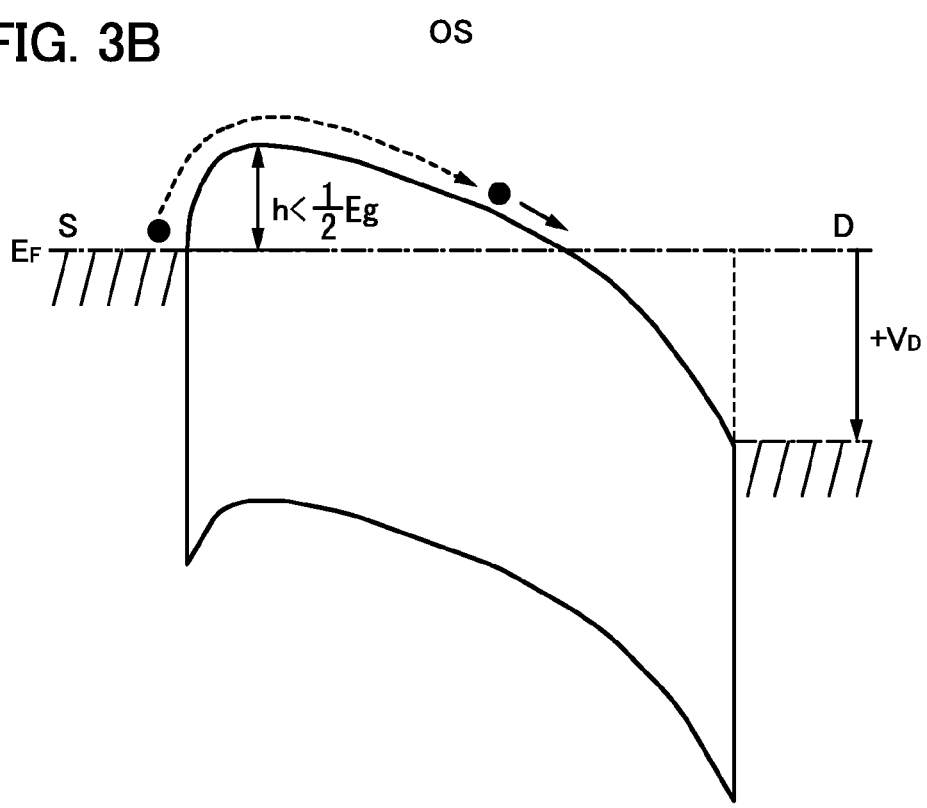

FIGS. 3A and 3B are energy band diagrams (schematic diagrams) of a cross section taken along line A-A' in FIG. 2. FIG. 3A illustrates the case where a voltage applied to the source is equal to a voltage applied to the drain ($V_D=0V$), and FIG. 3B illustrates the case where a positive potential with respect to the source is applied to the drain ($V_D>0$) and a positive voltage is applied to the gate electrode ($V_G>0$).

Figure 5:
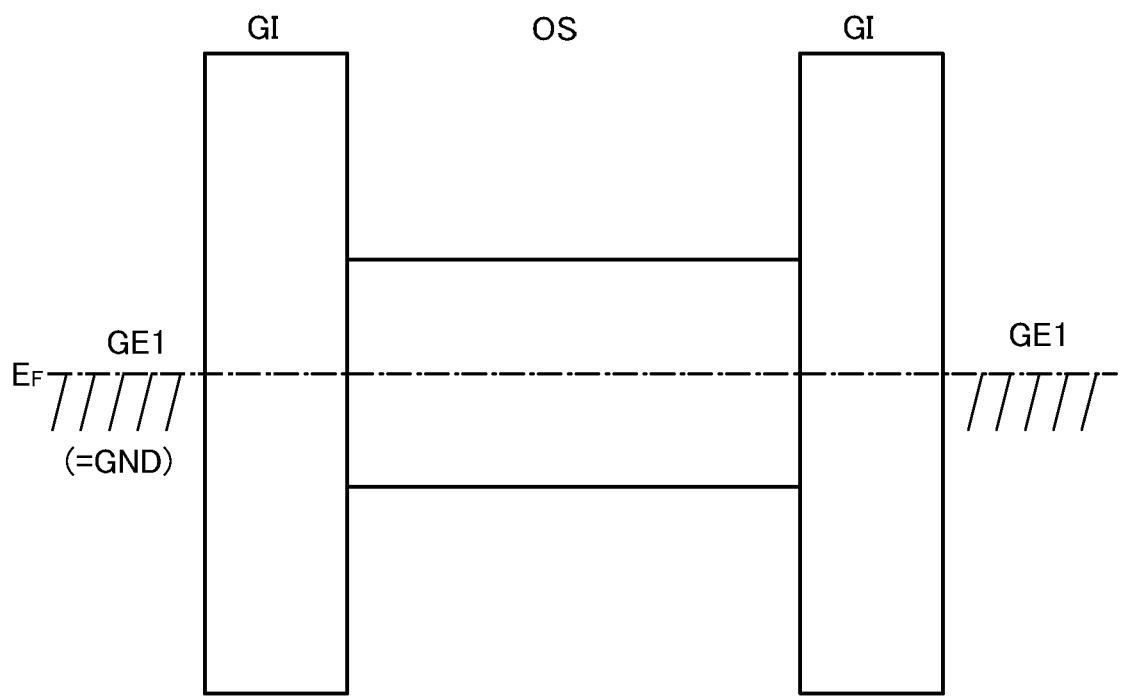
FIG. 5 is an energy band diagram (a schematic diagram) of a cross section taken along line B-B' in FIG. 2.
Figure 6A:
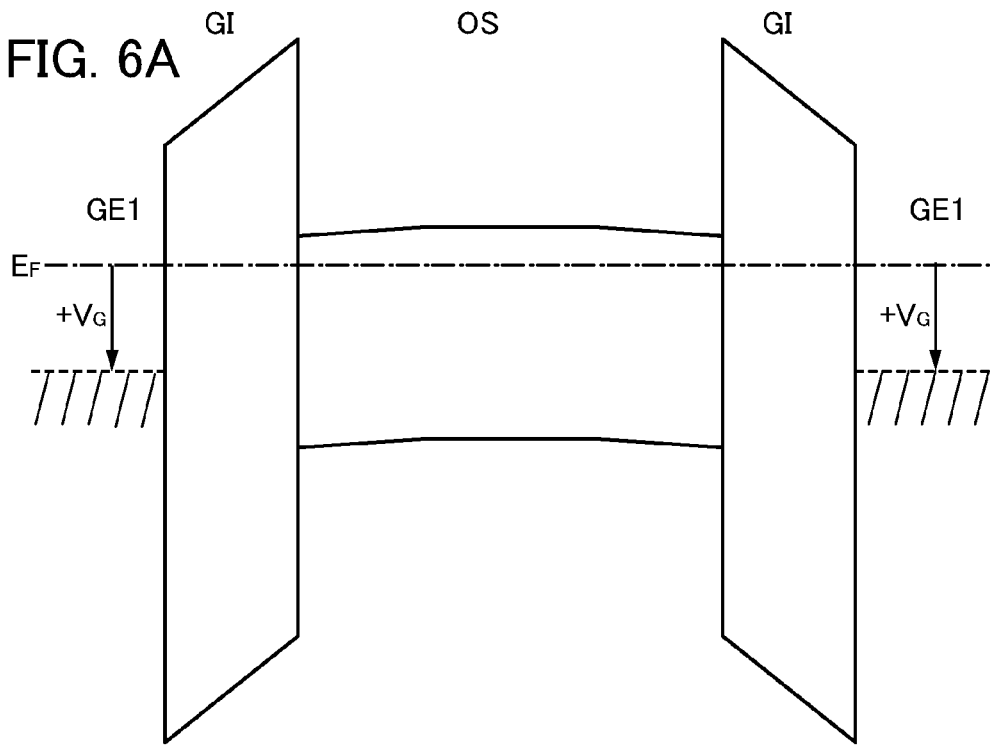
FIG. 6A illustrates a state where a positive potential (+V$_G$) is applied to a gate (GE1)
Figure 6B:
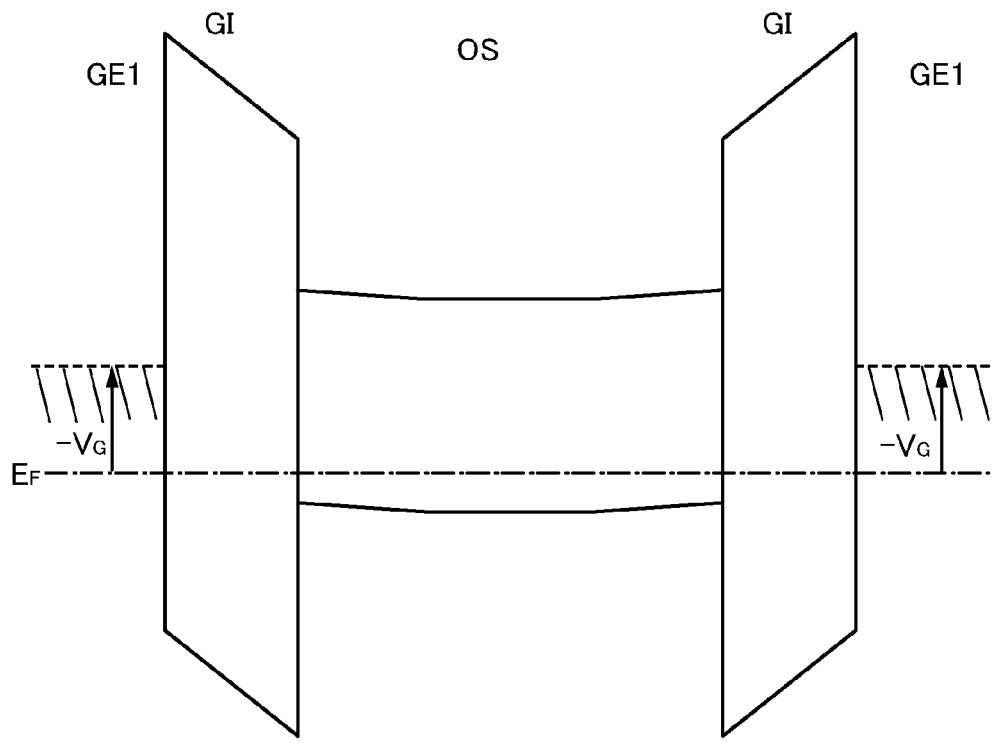
FIG. 6B illustrates a state where a negative potential (−V$_G$) is applied to the gate (GE1)

FIG. 5 is an energy band diagram (a schematic diagram) of a cross section taken along line B-B' in FIG. 2 in the case where the gate voltage is 0 V. FIG. 6A illustrates a state where a positive potential (+$V_G$) is applied to the gate (GE1), in other words, a case where the transistor is in an on-state where carriers (electrons) flow between the source and the drain. FIG. 6B illustrates a state where a negative potential (−$V_G$) is applied to the gate (GE1), in other words, a case where the transistor is in an off-state.

FIG. 4 illustrates a relation between a vacuum level and a work function ($\phi_M$) of metal and a relation between the vacuum level and an electron affinity ($\chi$) of an oxide semiconductor.

Metal is degenerated and the Fermi level is located in the conduction band. On the other hand, a conventional oxide semiconductor is typically an n-type semiconductor, in which case the Fermi level ($E_F$) is away from the intrinsic Fermi level ($E_i$) located in the middle of a band gap and is located closer to the conduction band. Note that it is known that some hydrogen is a donor in an oxide semiconductor and is one factor causing an oxide semiconductor to be an n-type semiconductor.

On the other hand, an oxide semiconductor according to one embodiment of the present invention is an intrinsic (i-type) semiconductor or a substantially intrinsic semiconductor which is obtained by removing hydrogen that is an n-type impurity from an oxide semiconductor and highly purifying the oxide semiconductor so that impurities that are not main components of the oxide semiconductor are prevented from being contained therein as much as possible. In other words, a feature of one embodiment of the present invention is that a highly purified i-type semiconductor, or a semiconductor close thereto, is obtained not by adding an impurity but by removing an impurity such as hydrogen or water as much as possible. This enables the Fermi level ($E_F$) to be at the same level as the intrinsic Fermi level ($E_i$).

In the case where the band gap ($E_g$) of an oxide semiconductor is 3.15 eV, the electron affinity ($\chi$) is said to be 4.3 eV. The work function of titanium (Ti) contained in the source electrode and the drain electrode is substantially equal to the electron affinity ($\chi$) of the oxide semiconductor. In that case, a Schottky barrier for electrons is not formed at an interface between the metal and the oxide semiconductor.

That is, in the case where the work function of metal ($\phi_M$) and the electron affinity ($\chi$) of the oxide semiconductor are equal to each other and the metal and the oxide semiconductor are in contact with each other, an energy band diagram (a schematic diagram) as illustrated in FIG. 3A is obtained.

In FIG. 3B, a black circle (•) represents an electron, and when a positive potential is applied to the drain, the electron is injected into the oxide semiconductor over the barrier (h) and flows toward the drain. In that case, the height of the barrier (h) changes depending on the gate voltage and the drain voltage; in the case where a positive drain voltage is applied, the height of the barrier (h) is smaller than the height of the barrier in FIG. 3A where no voltage is applied, i.e., ½ of the band gap ($E_g$).

The thickness of the oxide semiconductor film is greater than or equal to 1 μm, preferably greater than or equal to 3 μm, more preferably greater than or equal to 10 μm, and the carrier density is low. Thus, in the state where a positive potential (+$V_G$) is applied to the gate (GE1), as illustrated in FIG. 6A, the degree of curve of the band at a surface of the oxide semiconductor layer is small, the lower end of the conduction band approaches the Fermi level, and the entire oxide semiconductor film is stable in terms of energy. Therefore, electrons flow more easily not only in the vicinity of the gate insulating film but also in the entire region of the oxide semiconductor; as a result, a channel is formed in the entire region of the oxide semiconductor and a larger amount of current can flow. On the other hand, off-state current, i.e., current which flows in the state where a negative potential (−$V_G$) is applied to the gate (GE1), is made to flow by generation and recombination of electrons and holes through direct recombination or indirect recombination; however, since an oxide semiconductor has a wide band gap and a large amount of thermal energy is needed for electronic excitation, direct recombination and indirect recombination are less likely to occur. Thus, in the state where a negative potential (−$V_G$) is applied to the gate (GE1), since the number of holes that are minority carriers is substantially zero, direct recombination and indirect recombination are less likely to occur and the amount of current is extremely small; as a result, the value of current in a channel per unit area is lower than or equal to 100 aA/μm, preferably lower than or equal to 10 aA/μm, more preferably lower than or equal to 1 aA/μm, which is close to zero.

Next, the intrinsic carrier density of the oxide semiconductor will be described.

The intrinsic carrier density n, contained in a semiconductor is calculated by approximation of Fermi-Dirac distribution in accordance with Fermi-Dirac statics by the Boltzmann distribution formula (see Formula 2).

$$n_i = \sqrt{N_C N_V} \exp\left(-\frac{E_g}{2kT}\right) \quad \text{[Formula 2]}$$

The intrinsic carrier density $n_i$ obtained by the approximate expression is a relational expression of effective density of states in a conduction band $N_C$, effective density of states in a valence band $N_V$, and a band gap $E_g$. From Formula 2, the intrinsic carrier density $n_i$ of silicon is $1.45 \times 10^{10}$ cm$^{-3}$, and the intrinsic carrier density $n_i$ of an oxide semiconductor (an In—Ga—Zn—O film here) is $1.2 \times 10^{-7}$ cm$^{-3}$; that is, the carrier density of silicon is $10^{17}$ times that of an oxide semiconductor. In other words, it is found that the intrinsic carrier density of an oxide semiconductor is extremely low as compared with that of silicon.

Next, the width of a depletion layer and the Debye length in the case where a negative potential (−$V_G$) is applied to the gate (GE1) will be described below.

When voltage is applied to a MOS transistor formed using a semiconductor having a donor density $N_d$, an insulator, and a metal, the maximum width of a depletion layer $T_{D\ MAX}$ formed in the semiconductor can be calculated by Formula 3.

$$T_{D\ MAX} = \sqrt{\frac{2\varepsilon_S \varepsilon_0 (2\phi_F)}{qN_d}} \quad \text{[Formula 3]}$$

The maximum width of a depletion layer can be expressed as a functional of the donor density and a Fermi potential, and the Fermi potential $\phi_F$ can be calculated by Formula 4.

$$\phi_F = \frac{kT}{q} \ln \frac{N_d}{n_i} \quad \text{[Formula 4]}$$

The Debye length $L_D$ of the MOS transistor can be calculated by Formula 5.

$$L_D = \sqrt{\frac{\varepsilon_s \varepsilon_0 kT}{q^2 N_d}} \quad \text{[Formula 5]}$$

Note that $\varepsilon_s$, $\varepsilon_0$, $N_d$, q, k, and T respectively represent dielectric constant of an oxide semiconductor, permittivity of a vacuum, donor density, elementary electric charge, Boltzmann constant, and temperature.

The maximum width of a depletion layer and the Debye length of a MOS transistor using silicon and the maximum width of a depletion layer and the Debye length of a MOS transistor using an oxide semiconductor was calculated, where $n_i$ (intrinsic carrier density) of silicon, $\varepsilon_s$ thereof, $n_i$ of the oxide semiconductor, and $\varepsilon_s$ thereof are respectively set to $1.45 \times 10^{10}$ cm$^{-3}$, 11.9, $1.2 \times 10^{-7}$ cm$^{-3}$, and 10. Each of the transistors here used for the calculation has a horizontal MOS transistor structure in which a channel is formed in parallel to a surface of a substrate. Note that the maximum width of the depletion layer here corresponds to the width of the depletion layer that spreads perpendicular to the substrate. Note also that a depletion layer in a vertical MOS transistor spreads in a manner similar to that of the depletion layer in the horizontal MOS transistor.

When silicon is used, the donor density corresponds to density of impurities (P). When an oxide semiconductor is used, oxygen deficiency and hydrogen contribute to formation of donors.

As the donor density is decreased, the maximum width of a depletion layer calculated by Formula 4 is increased and the Debye length calculated by Formula 5 is increased. It is also found that the maximum width of a depletion layer $T_{D\_MAX}$ depends on the intrinsic carrier density $n_i$ and that the depletion layer spreads more when the oxide semiconductor having lower is used than when silicon is used. Further, as the donor density ($N_d$) is decreased, the Debye length is increased and the depletion layer spreads in the whole oxide semiconductor. Typically, when the donor density is from $1 \times 10^{12}$ cm$^{-3}$ to $1 \times 10^{18}$ cm$^{-3}$, the maximum width of a depletion layer in an oxide semiconductor and silicon is on the order of submicrons or several tens of micrometers and the Debye length in the oxide semiconductor and silicon is from several nanometers to several micrometers. It is also found that, when the donor density ranges from $1 \times 10^{-5}$ cm$^{-3}$ to $1 \times 10^{1}$ cm$^{-3}$, the maximum width of a depletion layer in the oxide semiconductor is drastically increased from several tens micrometers to several thousands of micrometers, the Debye length is drastically increased from several micrometers to several hundreds of micrometers, and the depletion layer spreads in the whole oxide semiconductor.

From the above, since the oxide semiconductor has a wide band gap and a low intrinsic carrier density, the maximum width of a depletion layer and the Debye length are increased, and the depletion layer spreads in the entire region of the oxide semiconductor in an off-state; as a result, the off-state current can be reduced to a value as close to zero as possible.

By highly purifying the oxide semiconductor to make an intrinsic (i-type) semiconductor or a substantially intrinsic semiconductor so that impurities that are not main components of the oxide semiconductor are not contained as much as possible, the interface characteristics with a gate insulating film become obvious. Therefore, the gate insulating film is preferably formed using a material that can form a favorable interface with the oxide semiconductor. For example, it is preferable to use a dense insulating film formed by a CVD method using high-density plasma generated with a power supply frequency in the range of the VHF band to the microwave band, or an insulating film formed by a sputtering method. Further, in order to obtain a favorable interface between the gate insulating film and a gate electrode, on a surface of the gate insulating film, a dense insulating film formed by a CVD method using high-density plasma generated with a power supply frequency in the range of the VHF band to the microwave band may be formed.

By highly purifying an oxide semiconductor in this manner so that impurities that are not main components of the oxide semiconductor are not contained as much as possible, a transistor with high on-state current, a low off-state current, a high on/off ratio, and favorable operation characteristics can be manufactured. Further, fluctuation in on-state current, field-effect mobility, and a threshold voltage due to temperature change is extremely small.

Here, the drain withstand voltage of a transistor using an oxide semiconductor will be described.

When the electric field in the semiconductor reaches a certain threshold value, impact ionization occurs, carriers accelerated by the high electric field impact crystal lattices in a depletion layer, thereby generating pairs of electrons and holes. When the electric field becomes even higher, the pairs of electrons and holes generated by the impact ionization are further accelerated by the electric field, and the impact ionization is repeated, resulting in an avalanche breakdown in which current is increased exponentially. The impact ionization occurs because carriers (electrons and holes) have kinetic energy that is larger than or equal to the band gap of the semiconductor. The impact ionization coefficient that shows probability of impact ionization has correlation with the band gap. It is known that the impact ionization is unlikely to occur as the band gap is increased.

Since the band gap of the oxide semiconductor is 3.15 eV, which is larger than the band gap of silicon, 1.12 eV, the avalanche breakdown is expected to be unlikely to occur. Therefore, a transistor using the oxide semiconductor has a high drain withstand voltage, and an exponential sudden increase of on-state current is expected to be unlikely to occur when a high electric field is applied.

Next, hot-carrier degradation of a transistor using an oxide semiconductor will be described.

The hot-carrier degradation means a phenomenon that electrons that are accelerated to be rapid become a fixed charge by being injected in a gate oxide film in the vicinity of a drain in a channel or form a trap level at the interface between the gate insulating film and the oxide semiconductor film. The factors of the hot-carrier degradation are channel-hot-electron injection (CHE injection) and drain-avalanche-hot-carrier injection (DAHC injection).

Since the band gap of silicon is narrow, electrons are likely to be generated like an avalanche owing to an avalanche breakdown, and electrons that are accelerated to be so rapid as to go over a barrier to the gate insulating film are increased in number. However, the oxide semiconductor described in this embodiment has a wide band gap; therefore, the avalanche breakdown is unlikely to occur and resistance to the hot-carrier degradation is higher than that of silicon. Note that although the band gap of silicon carbide which is one of materials having high withstand voltage and that of an oxide semiconductor are substantially equal to each other, electrons are less likely to be accelerated in an oxide semiconductor because the mobility in an oxide semiconductor is approximately one-hundredth as high as that of silicon carbide. Further, a barrier between an oxide semiconductor and an oxide film that is a gate insulating film is larger than a barrier between any of silicon carbide, gallium nitride, and silicon and an oxide film that is a gate insulating film; therefore, in the case of an oxide semiconductor, the number of electrons injected to the oxide film is extremely small, hot-carrier degradation is less likely to be caused than in the case of silicon carbide, gallium nitride, or silicon, and it can be said that drain withstand voltage is high. Thus, low-concentration impurity regions do not need to be provided between an oxide semiconductor functioning as a channel and source and drain electrodes so that an extremely simple transistor structure can be realized and the number of manufacturing steps of which can be reduced.

From the above, a transistor using an oxide semiconductor has high drain withstand voltage; specifically, such a transistor can have drain withstand voltage greater than or equal to 100 V, preferably greater than or equal to 500 V, more preferably greater than or equal to 1 kV.

Comparison between a transistor using silicon carbide, which is a typical example of a transistor, and a transistor using an oxide semiconductor will be described below. Here, 4H—SiC is used as the silicon carbide.

An oxide semiconductor and 4H—SiC have some things in common. One example is intrinsic carrier density. Using the Fermi-Dirac distribution at normal temperature, the intrinsic carrier density of the oxide semiconductor is estimated to approximately $10^{-7}$ cm$^{-3}$, which is extremely low like the carrier density of 4H—SiC, i.e., $6.7 \times 10^{-11}$ cm$^{-3}$.

In addition, the energy band gap of the oxide semiconductor is 3.0 eV to 3.5 eV and that of 4H—SiC is 3.26 eV, which means that both the oxide semiconductor and the silicon carbide are wide-gap semiconductors.

However, the manufacturing temperature of transistors using an oxide semiconductor and silicon carbide is largely different. Heat treatment for activation at 1500° C. to 2000° C. is needed in the case of using silicon carbide. In contrast, in the case of using an oxide semiconductor, an oxide semiconductor having crystallinity can be manufactured by heat treatment at a temperature higher than or equal to 450° C. and lower than or equal to 850° C., preferably higher than or equal to 550° C. and lower than or equal to 750° C., which allows a transistor to be manufactured over a large-sized substrate. In addition, throughput can be increased.

A manufacturing process of a SiC-MOSFET includes a step of doping with an impurity that can be a donor or an acceptor (e.g., phosphorus or boron) and a high-temperature heat treatment step for activation. Here, it is to be noted that an oxide semiconductor has a relatively high electron affinity. Accordingly, by selecting metal having an appropriate work function for an electrode, an ohmic contact can be formed between the oxide semiconductor and the electrode without a step of doping with an impurity in a manufacturing process of a transistor. In this manner, simplification of the process can be realized because an n$^+$ region is easily formed in the contact portion.

Note that considerable research has been done on properties of oxide semiconductors such as density of states (DOS) in the band gap; however, the research does not include the idea of sufficiently reducing the DOS itself. In this embodiment, a highly purified oxide semiconductor is manufactured by removing water or hydrogen which might induce the DOS in the energy gap from the oxide semiconductor. This is based on the idea of sufficiently reducing the DOS itself. Thus, excellent industrial products can be manufactured.

Further, it is also possible to form a more highly purified (i-type) oxide semiconductor by supplying oxygen to a dangling bond of metal which is generated by lack of oxygen and reducing the DOS due to lack of oxygen. For example, an oxide film containing an excessive amount of oxygen is formed in close contact with a channel formation region and oxygen is supplied from the oxide film, whereby the DOS due to oxygen deficiency can be reduced.

It is said that a defect of the oxide semiconductor is caused by a shallow level of 0.1 eV to 0.2 eV below the conduction band due to excessive hydrogen, a deep level due to lack of oxygen, or the like. The technical idea that hydrogen is drastically reduced and oxygen is sufficiently supplied in order to eliminate such a defect would be right.

An oxide semiconductor is generally considered as an n-type semiconductor; however, in this embodiment, an i-type semiconductor is realized by removing an impurity, particularly water or hydrogen. In this respect, it can be said that one embodiment of the present invention includes a novel technical idea because it is different from an i-type semiconductor such as silicon added with an impurity. In addition, density of a heavy element, e.g., an impurity such as iron or nickel, which is not contained in the oxide semiconductor is preferably less than or equal to $1 \times 10^{15}$ cm$^{-3}$.

By making the oxide semiconductor be an i-type semiconductor, favorable temperature characteristics of the transistor can be obtained; specifically, in terms of the current vs. voltage characteristics of the transistor, on-state current, off-state current, field-effect mobility, an S value, and a threshold voltage are hardly fluctuated at a temperature ranging from −25° C. to 150° C., and the current vs. voltage characteristics are hardly degraded by the temperature.

In the transistor using an oxide semiconductor which is described in this embodiment, mobility at a channel is a little lower than that in a transistor using silicon carbide; however, a current value and device characteristics of the transistor can be improved by increasing the drain voltage and the channel width (W).

A technical idea of this embodiment is that an impurity is not added to an oxide semiconductor and on the contrary the oxide semiconductor itself is highly purified by intentionally removing an impurity such as water or hydrogen which undesirably exists therein. In other words, the oxide semiconductor is highly purified by removing water or hydrogen which forms a donor level, reducing oxygen deficiency, and sufficiently supplying oxygen that is a main component of the oxide semiconductor.

In the oxide semiconductor just after being deposited, hydrogen at density of $1 \times 10^{20}$ cm$^{-3}$ to $9 \times 10^{20}$ cm$^{-3}$ is measured using secondary ion mass spectrometry (SIMS). The oxide semiconductor is highly purified and made to be an i-type (intrinsic) semiconductor by intentionally removing water or hydrogen which forms a donor level and further by adding oxygen (one of components of the oxide semiconductor), which is reduced at the same time as removal of water or hydrogen, to the oxide semiconductor.

In this embodiment, the amount of water and hydrogen in the oxide semiconductor is preferably as small as possible, and the number of carriers in the oxide semiconductor is preferably as small as possible. In other words, carrier density lower than $1 \times 10^{12}$ cm$^{-3}$, or preferably lower than $1.45 \times 10^{10}$ cm$^{-3}$, i.e., lower than the lower limit of measurement is desirable. Further, in the technical idea of this embodiment, an ideal carrier density is 0 or close to 0. In particular, the oxide semiconductor can be highly purified in such a manner that the oxide semiconductor is subjected to heat treatment in an oxygen atmosphere, a nitrogen atmosphere, or an ultra-dry air atmosphere (in which the content of water is lower than or equal to 20 ppm, preferably lower than or equal to 1 ppm, more preferably lower than or equal to 10 ppb) at a temperature higher than or equal to 450° C. and lower than or equal to 850° C., preferably higher than or equal to 550° C. and lower than or equal to 750° C. so that water or hydrogen that serves as an n-type impurity is removed from the oxide semiconductor. By highly purifying the oxide semiconductor by removal of an impurity such as water or hydrogen, the carrier density can be lower than $1\times10^{12}$ cm$^{-3}$, preferably lower than $1.45\times10^{10}$ cm$^{-3}$, i.e., lower than the lower limit of measurement.

Further, the heat treatment is performed at a temperature higher than or equal to 450° C. and lower than or equal to 850° C., preferably higher than or equal to 600° C. and lower than or equal to 700° C., in which case the oxide semiconductor can be highly purified and crystallized so as to be an oxide semiconductor having a c-axis aligned polycrystalline region in which crystals grow from a surface of the oxide semiconductor to the inside portion thereof. The c-axis aligned polycrystalline region is a region which has a plurality of single crystal regions in each of which the c-axis is aligned to the perpendicular direction to the surface.

In an embodiment of the present invention, the second oxide semiconductor film is provided using the oxide semiconductor film having the c-axis aligned polycrystalline region as a seed crystal, and heat treatment is performed at a temperature higher than or equal to 450° C. and lower than or equal to 850° C., preferably higher than or equal to 550° C. and lower than or equal to 750° C., whereby the second oxide semiconductor film can have a polycrystalline region which is c-axis aligned like the seed crystal. That is, ideal axial growth or epitaxial growth can be caused in which the direction of the c-axis of the seed crystal and that of the c-axis of the second oxide semiconductor film are identical.

The second oxide semiconductor film the direction of c-axis of which is identical to that of the c-axis of the seed crystal can be obtained not only by solid-phase growth caused by the heat treatment after deposition but also by being deposited, typically sputtered, while heating is performed at a temperature higher than or equal to 200° C. and lower than or equal to 600° C., preferably higher than or equal to 200° C. and lower than or equal to 550° C., where crystal growth can be caused in the second oxide semiconductor film while the second oxide semiconductor film is deposited.

Furthermore, in a transistor, an oxide semiconductor functions as a path in which carriers flow by reducing or preferably eliminating carriers of the oxide semiconductor. As a result, the oxide semiconductor is an i-type (intrinsic) semiconductor which is highly purified and includes extremely small number of or no carriers, and off-state current can be extremely small in the state where the transistor is in an off-state, which is the technical idea of this embodiment.

In addition, when the oxide semiconductor functions as a path, and the oxide semiconductor itself is an i-type (intrinsic) semiconductor which is highly purified so as to include extremely small number of or no carriers, carriers are supplied from source and drain electrodes. By appropriately selecting the electron affinity ($\chi$) of the oxide semiconductor, the Fermi level which may ideally correspond to the intrinsic Fermi level, and the work function of a material of the source and drain electrodes, carriers can be injected from the source and drain electrodes so that an n-channel transistor and a p-channel transistor can be manufactured as appropriate.

On the other hand, a horizontal transistor in which a channel is formed substantially in parallel with a substrate needs a source and a drain as well as the channel, so that an area occupied by the transistor in the substrate is increased, which hinders miniaturization. However, a source, a channel, and a drain are stacked in a vertical transistor, whereby an occupation area in a substrate surface can be reduced. As a result of this, it is possible to miniaturize the transistor.

As described above, the oxide semiconductor film is highly purified so that an impurity that is not a main component of the oxide semiconductor film, typically hydrogen, water, hydroxy group, or hydride, may be contained as little as possible, and the oxide semiconductor film is made to have the polycrystalline region, whereby good operation of the transistor can be obtained. In particular, withstand voltage can be higher, a short channel effect can be reduced, and a high on-off ratio can be obtained. In addition, the amount of shift in a threshold voltage of the transistor between before and after a BT test can be suppressed, whereby high reliability can be obtained. Temperature dependence of electrical characteristics can also be suppressed. Further, an oxide semiconductor film having a polycrystalline region can be formed thicker at a relatively low temperature by the above-described method in which a flat-plate-shaped polycrystalline region is formed in an oxide semiconductor film and then crystal growth is caused with the use of the polycrystalline region as a seed crystal, in spite of the fact that any metal oxide which has been already reported is in an amorphous state or a polycrystalline state or can be in a single crystal state only by a treatment at a temperature as high as around 1400° C. Therefore, a wider industrial application can be realized.

Embodiment 2

In this embodiment, a transistor having a structure different from that of Embodiment 1 will be described with reference to FIGS. 7A and 7B.

Figure 7A:
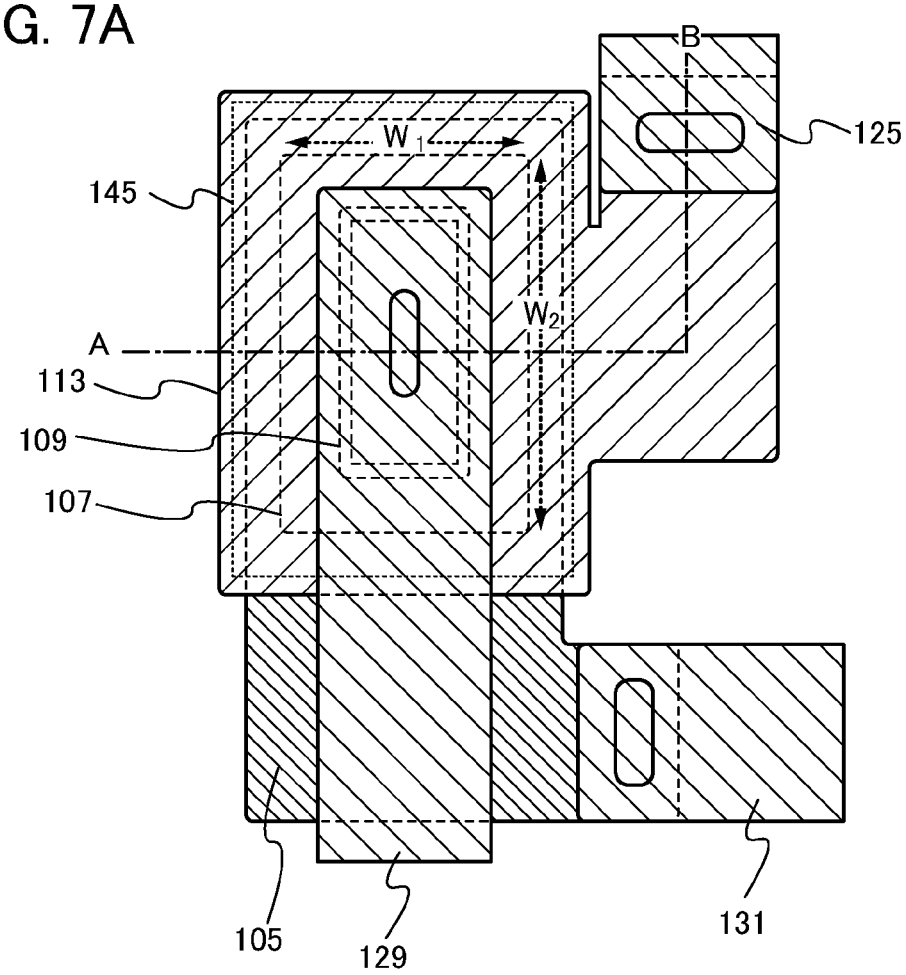
FIGS. 7A and 7B are a top view and a cross-sectional view illustrating a transistor.
Figure 7B:
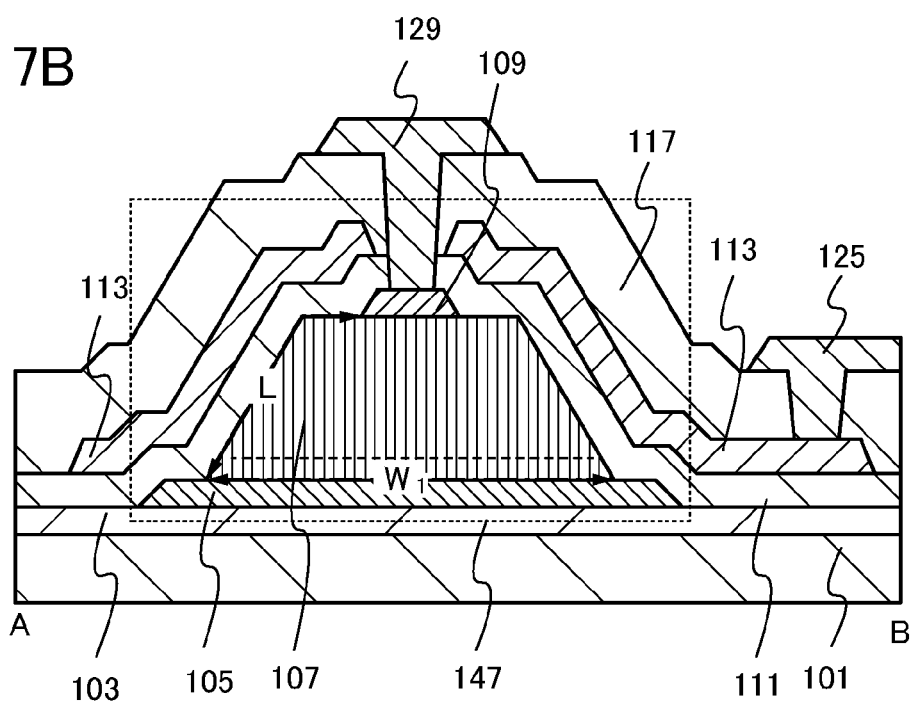

FIG. 7A is a top view of a transistor 147, and FIG. 7B corresponds to a cross-sectional view taken along dashed line A-B in FIG. 7A.

As illustrated in FIG. 7B, the first electrode 105, the oxide semiconductor film 107, and the second electrode 109 are stacked over the insulating film 103 formed over the substrate 101. Note that this structure is different from that in Embodiment 1 in that the periphery of the second electrode 109 is inside the periphery of the oxide semiconductor film 107. The gate insulating film 111 is provided so as to cover the first electrode 105, the oxide semiconductor film 107, and the second electrode 109. Over the gate insulating film 111, the third electrode 113 is provided so as to face at least side surfaces of the oxide semiconductor film and the second electrode. The insulating film 117 functioning as an interlayer insulating film is provided over the gate insulating film 111 and the third electrode 113. Openings are formed in the insulating film 117, and the wiring 131 (see FIG. 7A) connected through the opening to the first electrode 105, the wiring 129 connected through the opening to the second electrode 109, and the wiring 125 connected through the opening to the third electrode 113 are formed.

In this embodiment, as in Embodiment 1, the oxide semiconductor film 107 has crystallinity and the polycrystalline region of the oxide semiconductor film 107 is c-axis aligned in a direction perpendicular to the surface. That is, the c-axis direction of the oxide semiconductor film 107 corresponds to the direction perpendicular to the surface. Note that elements which are adjacent to each other in the a-b plane are of the same kind.

The oxide semiconductor film 107 is highly purified and the hydrogen concentration therein is lower than or equal to $1\times10^{18}$ cm$^{-3}$, preferably lower than or equal to $1\times10^{16}$ cm$^{-3}$, more preferably substantially 0. The carrier density of the oxide semiconductor film 107 is lower than $1\times10^{12}$ cm$^{-3}$, preferably lower than $1.45\times10^{10}$ cm$^{-3}$, which is lower than the lower limit of measurement. That is, the carrier density of the oxide semiconductor film is as close to zero as possible. A band gap is greater than or equal to 2 eV, preferably greater than or equal to 2.5 eV, more preferably greater than or equal to 3 eV.

In the transistor of this embodiment, the channel length L means a distance between the first electrode 105 and the second electrode 109 in a region of the oxide semiconductor which is in contact with the gate insulating film in a cross-sectional structure. Further, the channel width W means the length between the end portions of the oxide semiconductor film that are in contact with the first electrode or the second electrode. Note that, here, the length of the end portion of the oxide semiconductor film that is in contact with one of the first electrode and the second electrode which has a larger area than the other is W. In this embodiment, since the shape of the top surface of the oxide semiconductor film of the transistor is rectangular, the channel width W is the sum of $2W_1$ and $2W_2$. Note that in the case where the shape of the top surface of the oxide semiconductor film of the transistor is circular, the channel width W is $2\pi r$ where r is a radius of the circle.

In this embodiment, when compared with Embodiment 1, the channel length L is larger. In addition, there is influence of voltage applied to the third electrode 113 functioning as a gate electrode not only on the side surface of the oxide semiconductor film 107 but also on the top surface of the oxide semiconductor film 107. Thus, a channel can be more easily controlled than in Embodiment 1.

As described above, the oxide semiconductor film is highly purified so that an impurity that is not a main component of the oxide semiconductor film, typically hydrogen, water, hydroxy group, or hydride, may be contained as little as possible, and is made to have the polycrystalline region, whereby good operation of the transistor can be obtained. In particular, withstand voltage can be higher, a short channel effect can be reduced, and a high on-off ratio can be realized. In addition, the amount of shift in a threshold voltage of the transistor between before and after the BT test can be suppressed, whereby high reliability can be obtained. Temperature dependence of electrical characteristics can also be suppressed.

Embodiment 3

In this embodiment, a structure of a three-terminal type diode which is manufactured using the transistor described in Embodiment 1 or 2 will be described with reference to FIGS. 8A and 8B.

Figure 8A:
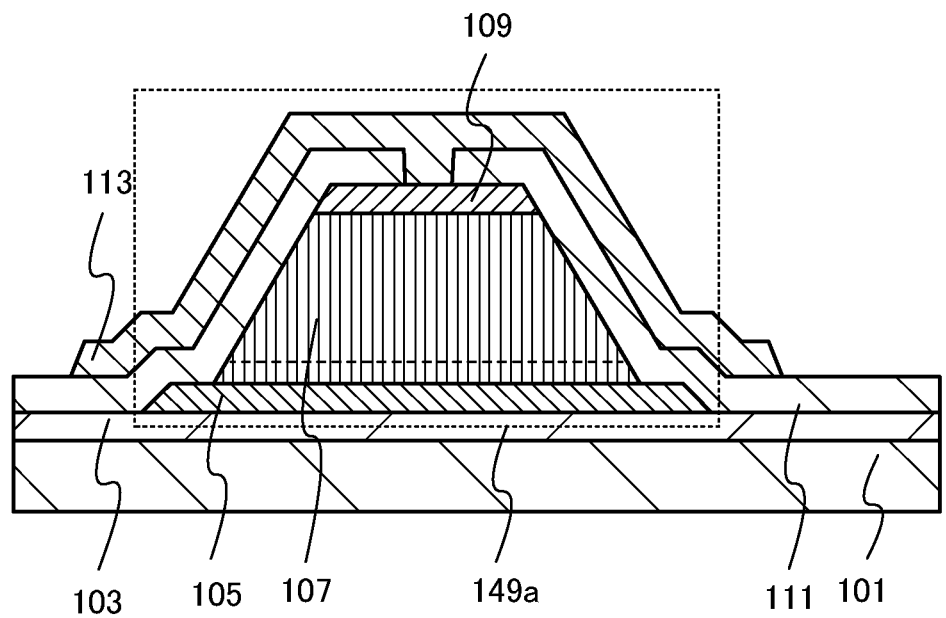
FIGS. 8A and 8B are cross-sectional views each illustrating a diode.
Figure 8B:
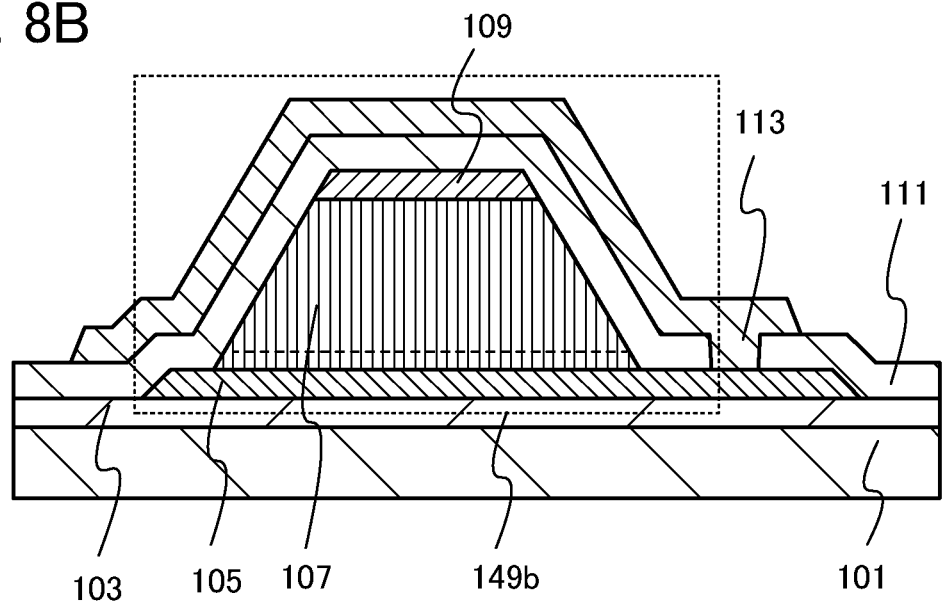

FIGS. 8A and 8B are each a cross-sectional view of a three-terminal type diode.

In a three-terminal type diode 149a illustrated in FIG. 8A, the first electrode 105, the oxide semiconductor film 107, and the second electrode 109 are stacked over the insulating film 103 formed over the substrate 101. The gate insulating film 111 is provided so as to cover the first electrode 105, the oxide semiconductor film 107, and the second electrode 109. The third electrode 113 is provided over the gate insulating film 111. Further, an opening is formed in the gate insulating film 111 and the second electrode 109 and the third electrode 113 are connected to each other through the opening.

In a three-terminal type diode 149b illustrated in FIG. 8B, the first electrode 105, the oxide semiconductor film 107, and the second electrode 109 are stacked over the insulating film 103 formed over the substrate 101. The gate insulating film 111 is provided so as to cover the first electrode 105, the oxide semiconductor film 107, and the second electrode 109. The third electrode 113 is provided over the gate insulating film 111. Further, an opening is formed in the gate insulating film 111 and the first electrode 105 and the third electrode 113 are connected to each other through the opening.

In each of the three-terminal type diodes described in this embodiment, the third electrode functioning as a gate electrode and one of a source electrode and a drain electrode are electrically connected. For example, in the case where the first electrode functioning as the drain electrode and the third electrode functioning as the gate electrode are electrically connected to each other, when voltage (a positive voltage) that is higher than that of the source electrode is applied to the drain electrode, a positive voltage is also applied to the gate electrode; thus, the transistor is turned on and forward current flows more easily. On the other hand, when voltage (a negative voltage) that is lower than that of the source electrode is applied to the drain electrode, the transistor is turned off and reverse current flows with more difficulty. Accordingly, a rectification property of the diode can be enhanced.

Note that although three-terminal type diodes are described in this embodiment, two-terminal type diodes which do not have the third electrodes can also be manufactured.

Embodiment 4

In this embodiment, transistors with high heat resistance will be described with reference to FIGS. 1A and 1B.

By using a substrate having a high heat-dissipation property as the substrate 101 illustrated in FIGS. 1A and 1B, a transistor with high heat resistance can be manufactured. Examples of the substrate having a high heat-dissipation property include a semiconductor substrate, a metal substrate, a plastic substrate, and the like. As typical examples of the semiconductor substrate, a single crystal semiconductor substrate such as a silicon substrate or a silicon carbide substrate, a polycrystalline semiconductor substrate, a compound semiconductor substrate such as a silicon germanium substrate, and the like can be given. As typical examples of the metal substrate, an aluminum substrate, a copper substrate, a stainless steel substrate, and the like can be given. As a typical example of the plastic substrate, a plastic substrate containing a carbon fiber, a metal fiber, a metal piece, or the like can be given. Note that the semiconductor substrate, the metal substrate, and the plastic substrate are not limited to the above substrates, and any substrate can be used as appropriate as long as it has a high heat-dissipation property.

By using an insulating film having high thermal conductivity as the insulating film 103 illustrated in FIGS. 1A and 1B, a transistor with high heat resistance can be manufactured. Examples of the insulating film having high thermal conductivity include an aluminum nitride film, an aluminum nitride oxide film, a silicon nitride film, and the like.

A semiconductor film may be formed between the first electrode 105 and the insulating film 103 illustrated in FIGS. 1A and 1B. As typical examples of the semiconductor film, a silicon film, a germanium film, a silicon carbide film, a diamond like carbon (DLC) film, and the like can be given.

Note that by using one or more of the above components, a transistor with high heat resistance can be manufactured.

Embodiment 5

In this embodiment, a transistor including the first electrode 105 and the second electrode 109 that are formed using materials having different work functions will be described.

In this embodiment, one of the first electrode 105 and the second electrode 109 is formed using a conductive material having a work function that is lower than or equal to the electron affinity of an oxide semiconductor, and the other of the first electrode 105 and the second electrode 109 is formed using a conductive material having a work function that is higher than the electron affinity of the oxide semiconductor.

For example, in the case where the electron affinity ($\chi$) of the oxide semiconductor is 4.3 eV, as the conductive material having a work function that is higher than the electron affinity of the oxide semiconductor, tungsten (W), molybdenum (Mo), chromium (Cr), iron (Fe), indium tin oxide (ITO), or the like can be used. As the conductive material having a work function that is lower than or equal to the electron affinity of the oxide semiconductor, titanium (Ti), yttrium (Y), aluminum (Al), magnesium (Mg), silver (Ag), zirconium (Zr), or the like can be used.

First, described is a case where an electrode functioning as a drain is formed using a conductive material having a work function that is higher than the electron affinity of the oxide semiconductor, and an electrode functioning as a source is formed using a conductive material having a work function that is lower than or equal to the electron affinity of the oxide semiconductor.

The relation among the work function of the conductive material for forming the electrode functioning as a drain $\phi_{md}$, the work function of the conductive material for forming the electrode functioning as a source $\phi_{ms}$, and the electron affinity $\chi$ is set so as to be expressed as Formula 6.

$$\phi ms \leq \chi \leq \phi md \quad \text{[Formula 6]}$$

As can be seen, the work function of the conductive material of the electrode functioning as a source is lower than or equal to the electron affinity of the oxide semiconductor; therefore, a barrier in an on-state of the transistor (for example, h in FIG. 3B) can be reduced, the transistor can be turned on at a low gate voltage, and a large amount of current can flow.

In another case, the relation between the work function $\phi_{md}$, the electron affinity $\chi$, and the work function $\phi_{ms}$ is set so as to be expressed as Formula 7.

$$\phi md \leq \chi \leq \phi ms \quad \text{[Formula 7]}$$

As can be seen, since the work function of the conductive material of the electrode functioning as a source is higher than the electron affinity of the oxide semiconductor, the barrier of the transistor becomes high. Accordingly, the amount of current in an off-state can be reduced.

Note that the electrode functioning as a source can be one of the first electrode 105 and the second electrode 109, and the electrode functioning as a drain can be the other of the first electrode 105 and the second electrode 109.

From the above, by forming one of the first electrode 105 and the second electrode 109 using a conductive material having a work function that is lower than or equal to the electron affinity of the oxide semiconductor and by forming the other of the first electrode 105 and the second electrode 109 using a conductive material having a work function that is higher than the electron affinity of the oxide semiconductor, on-state characteristics or off-state characteristics of a transistor can be improved.

In addition, the rectification property of the diode described in Embodiment 3 can also be enhanced by satisfying Formula 6 or 7.

Embodiment 6

In this embodiment, a manufacturing process of the transistor illustrated in FIGS. 1A and 1B or FIGS. 7A and 7B will be described with reference to FIGS. 9A to 9E, FIGS. 10A to 10C, FIGS. 11A and 11B, and FIGS. 12A to 12C.

Figure 9A:
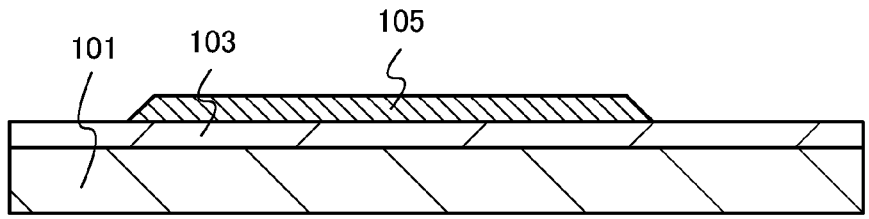
FIGS. 9A to 9E are cross-sectional views illustrating a method for manufacturing a transistor.

As illustrated in FIG. 9A, the insulating film 103 is formed over the substrate 101, and the first electrode 105 is formed over the insulating film 103. The first electrode 105 functions as one of the source electrode and the drain electrode of the transistor.

The insulating film 103 can be formed by a sputtering method, a CVD method, a coating method, or the like.

Note that when the insulating film 103 is formed by a sputtering method, the insulating film 103 is preferably formed while hydrogen, water, hydroxy group, hydride, or the like remaining in a treatment chamber is removed. This is for preventing hydrogen, water, hydroxy group, hydride, or the like from being contained in the insulating film 103. An entrapment vacuum pump is preferably used for removing hydrogen, water, hydroxy group, hydride, or the like remaining in the treatment chamber. For example, a cryopump, an ion pump, or a titanium sublimation pump is preferably used as the entrapment vacuum pump. The evacuation unit can be a turbo pump provided with a cold trap. Since hydrogen, water, hydroxy group, hydride, or the like are evacuated in the treatment chamber which is evacuated using a cryopump, in the insulating film 103 formed in the treatment chamber, the concentration of an impurity contained in the insulating film 103 can be reduced.

As a sputtering gas used for formation of the insulating film 103, a high-purity gas from which an impurity such as hydrogen, water, hydroxy group, or hydride is removed to such a level that the impurity concentration is represented by the unit "ppm" or "ppb".

Examples of a sputtering method include an RF sputtering method in which a high-frequency power source is used for a sputtering power supply, a DC sputtering method, and a pulsed DC sputtering method in which a bias is applied in a pulsed manner. The RF sputtering method is mainly used in the case where an insulating film is formed, and the DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or films of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a sputtering method, a reactive sputtering method in which a target substance and a sputtering gas component are chemically reacted with each other during deposition to form a thin compound film thereof, or a bias sputtering method in which voltage is also applied to a substrate during deposition can be used.

As the sputtering in this specification, the above-described sputtering apparatus and the sputtering method can be employed as appropriate.

In this embodiment, the substrate 101 is carried into the treatment chamber. A sputtering gas containing high purity oxygen, from which hydrogen, water, hydroxy group, hydride, or the like is removed, is introduced into the treatment chamber, and a silicon oxide film is formed as the insulating film 103 over the substrate 101 using a silicon target. Note that when the insulating film 103 is formed, the substrate 101 may be heated.

For example, a silicon oxide film is formed with an RF sputtering method in the following conditions: a quartz (preferably, synthetic quartz) target is used; the substrate temperature is 108° C.; the distance between the substrate and the target (the T—S distance) is 60 mm; the pressure is 0.4 Pa; the high frequency power is 1.5 kW; and the atmosphere is an atmosphere containing oxygen and argon (the flow ratio of oxygen to argon is 1:1 (each flow rate is 25 sccm)). The film thickness may be 100 nm. Note that instead of a quartz (preferably, synthesized quartz) target, a silicon target can be used. Note that oxygen or a mixed gas of oxygen and argon is used as a sputtering gas.

For example, when the insulating film 103 is formed to have a stacked-layer structure, a silicon nitride film is formed using a silicon target and a sputtering gas containing high purity nitrogen from which hydrogen, water, hydroxy group, hydride, or the like is removed, between the silicon oxide film and the substrate. Also in this case, as in the case of the silicon oxide film, it is preferable to deposit a silicon nitride film while hydrogen, water, hydroxy group, hydride, or the like remaining in the treatment chamber is removed. Note that in this step, the substrate 101 may be heated.

In the case where a silicon nitride film and a silicon oxide film are stacked as the insulating film 103, the silicon nitride film and the silicon oxide film can be deposited in the same treatment chamber with the use of a common silicon target. First, the silicon nitride film is formed in such a manner that an etching gas containing nitrogen is introduced and a silicon target mounted on the treatment chamber is used. Then, the silicon oxide film is formed in such a manner that the gas is switched to an etching gas containing oxygen and the same silicon target is used. The silicon nitride film and the silicon oxide film can be formed successively without exposure to the air; thus, adsorption of an impurity such as hydrogen, water, hydroxy group, or hydride on a surface of the silicon nitride film can be prevented.

The first electrode 105 can be formed in such a manner that a conductive film is formed over the substrate 101 by a sputtering method, a CVD method, or a vacuum evaporation method, a resist mask is formed over the conductive film in a photolithography step, and the conductive film is etched using the resist mask. Alternatively, the first electrode 105 is formed by a printing method or an ink-jet method without using a photolithography step, so that the number of steps can be reduced. Note that end portions of the first electrode 105 preferably have a tapered shape, so that the coverage with a gate insulating film to be formed later is improved. When the angle formed between the end portion of the first electrode 105 and the insulating film 103 is greater than or equal to 30° and less than or equal to 60° (preferably, greater than or equal to 40° and less than or equal to 50°), the coverage with the gate insulating film to be formed later can be improved.

In this embodiment, as the conductive film to serve as the first electrode 105, a titanium film is formed to a thickness of 50 nm by a sputtering method, an aluminum film is formed to a thickness of 100 nm, and a titanium film is formed to a thickness of 50 nm. Next, etching is performed using the resist mask formed in the photolithography step, whereby the first electrode 105 is formed.

Figure 9B:
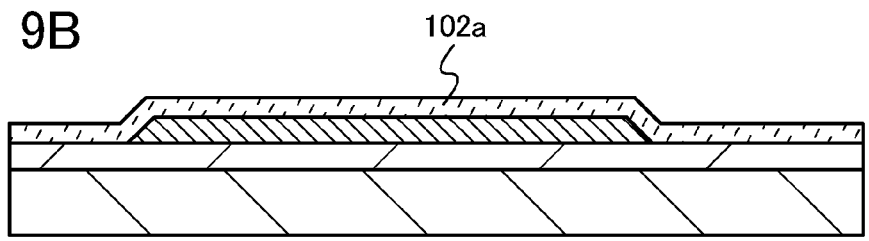

Next, as illustrated in FIG. 9B, a first oxide semiconductor film 102a with a thickness greater than or equal to 2 nm and less than or equal to 15 nm is formed over the insulating film 103 and the first electrode 105.

Here, a method for manufacturing the first oxide semiconductor film 102a will be described.

Over the insulating film 103 and the first electrode 105, the first oxide semiconductor film 102a is formed to a thickness greater than or equal to 2 nm and less than or equal to 15 nm by a sputtering method, a coating method, a printing method, or the like.

The first oxide semiconductor film 102a can be formed by a sputtering method in a rare gas (typically, argon) atmosphere, an oxygen atmosphere, or an atmosphere including a rare gas (typically, argon) and oxygen.

In addition, it is preferable that moisture or the like which remains in the sputtering apparatus is removed before, during, or after deposition of the first oxide semiconductor film 102a. In order to remove the remaining moisture in the sputtering apparatus, an entrapment vacuum pump is preferably used. For example, a cryopump, an ion pump, or a titanium sublimation pump is preferably used as the entrapment vacuum pump. The evacuation unit can be a turbo pump provided with a cold trap. From a film formation chamber of the sputtering apparatus in which exhaustion is performed with the use of a cryopump, a hydrogen atom, a compound including a hydrogen atom such as water ($H_2O$), or the like, for example, is exhausted. Accordingly, the concentration of an impurity contained in the oxide semiconductor film formed in the film formation chamber can be reduced.

As the first oxide semiconductor film 102a, any one of the following metal oxide films can be used: a four-component metal oxide film such as an In—Sn—Ga—Zn—O film; a three-component metal oxide film such as an In—Ga—Zn—O film, an In—Sn—Zn—O film, an In—Al—Zn—O film, a Sn—Ga—Zn—O film, an Al—Ga—Zn—O film, and a Sn—Al—Zn—O film; a two-component metal oxide film such as an In—Zn—O film, a Sn—Zn—O film, an Al—Zn—O film, a Zn—Mg—O film, a Sn—Mg—O film, and an In—Mg—O film; an In—O film; a Sn—O film; and a Zn—O film.

For the first oxide semiconductor film 102a, a material expressed by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

Note also that the first oxide semiconductor film 102a may be formed using an oxide semiconductor material represented by In-A-B—O. Here, A represents one or more kinds of elements selected from Group 13 elements such as gallium (Ga) and aluminum (Al), Group 14 elements such as silicon (Si) and germanium (Ge), and the like. B represents one or more kinds of elements selected from Group 12 elements such as zinc (Zn). It is to be noted that values of an In content, an A content, and a B content are arbitrary. The value of the A content may be 0. On the other hand, the value of the In content and that of the B content are not 0. In other words, the above expression may represent In—Ga—Zn—O, In—Zn—O, and the like.

When the first oxide semiconductor film is formed, a metal oxide target having a composition ratio of In:Ga:Zn=1: greater than or equal to 0 and less than or equal to 2: greater than or equal to 1 and less than or equal to 5 is used. In this embodiment, the first oxide semiconductor film is formed to a thickness of 5 nm in an oxygen atmosphere, an argon atmosphere, or a mixed atmosphere of argon and oxygen in the following conditions: an oxide semiconductor target (an In—Ga—Zn—O-based oxide semiconductor target ($In_2O_3$:$Ga_2O_3$:ZnO=1:1:2 [molar ratio] and In:Ga:Zn=1:1:1 [atom ratio])) is used; the distance between the substrate and the target is 170 mm, pressure is 0.4 Pa; and a direct current (DC) power source is 0.5 kW. Alternatively, as an oxide semiconductor target, a target having a composition ratio of In:Ga:Zn=1:1:0.5 [atom ratio], a target having a composition ratio of In:Ga:Zn=1:1:1 [atom ratio], a target having a composition ratio of In:Ga:Zn=1:1:2 [atom ratio], or a target having a composition ratio of In:Ga:Zn=1:0.5:2 [atom ratio] can be used. Further alternatively, a target having a composition ratio of In:Zn=1:1 [atom ratio], which does not contain Ga may be used. Field-effect mobility can be higher in the case where an In—Zn—O film is used than in the case where an In—Ga—Zn—O film is used. In this embodiment, since crystallization is intentionally caused by performing heat treatment in a later step, it is preferable to use an oxide semiconductor target in which crystallization is easily caused.

It is preferable that the relative density of the oxide semiconductor in the oxide semiconductor target is greater than or equal to 80%, more preferably greater than or equal to 95%, further preferably greater than or equal to 99.9%. When a target having a high relative density is used, the impurity concentration in an oxide semiconductor film to be formed can be reduced, so that a transistor with excellent electrical characteristics or high reliability can be obtained.

Further, preheat treatment is preferably performed before the first oxide semiconductor film 102a is formed, in order to remove moisture or hydrogen which remains on an inner wall of a sputtering apparatus, on a surface of the target, or inside a target material. As the preheat treatment, a method in which the inside of the film formation chamber is heated to 200° C. to 600° C. under reduced pressure, a method in which introduction and exhaust of nitrogen or an inert gas are repeated while the inside of the film formation chamber is heated, and the like can be given. After the preheat treatment, the substrate or the sputtering apparatus is cooled. Then, an oxide semiconductor film is formed without exposure to the air. Although a certain level of effect can be obtained when introduction and exhaust of nitrogen are repeated without heating, it is more preferable to perform the treatment with the inside of the film formation chamber heated.

Then, the first oxide semiconductor film 102a is subjected to the first heat treatment and at least part of the oxide semiconductor film is crystallized. The first heat treatment is performed at a temperature higher than or equal to 450° C. and lower than or equal to 850° C., preferably higher than or equal to 550° C. and lower than or equal to 750° C. Heating time is greater than or equal to 1 minute and less than or equal to 24 hours. By the first heat treatment, a first oxide semiconductor film 102b (also referred to as a first oxide semiconductor film having crystallinity) which has a polycrystalline region growing from the surface is formed (see FIG. 9C). The polycrystalline region grows from the surface to the inside portion and contains plate-like crystals whose average thickness is greater than or equal to 2 nm and less than or equal to 15 nm The polycrystalline region formed at the surface is c-axis aligned in a direction perpendicular to the surface. In this embodiment, an example is described in which most part of the first oxide semiconductor film is made to contain a polycrystal by the first heat treatment. The polycrystalline region having relatively uniform crystal alignment which is formed at the surface of the first oxide semiconductor film grows from the surface in the perpendicular direction; thus, the polycrystalline region can be formed without being affected by a base member.

Note that a crystal grain boundary exists in a region of the first oxide semiconductor film 102b which overlaps with a projected portion and a recessed portion made by the first electrode 105 and a polycrystal is contained in the region. Although the a-b plane, a-axis, and b-axis of each crystal in the polycrystal may not be identical in the first oxide semiconductor film 102b.

An example of a mechanism of formation of a crystal region having uniform crystal alignment at the surface of the first oxide semiconductor film in the case where the first oxide semiconductor film is, for example, an In—Ga—Zn—O film is described. By heat treatment, zinc contained in the In—Ga—Zn—O film diffuses and gathers in the vicinity of the surface so as to be a seed crystal. In the crystal growth at this time, crystals grow more in a direction parallel to the surface than in a direction perpendicular to the surface so that a flat-plate-shaped polycrystalline region is formed. In other words, crystallization is caused more easily in the a-b plane direction than in the c-axis direction. Further, in the flat-plate-shaped polycrystalline region, the a-b planes of the single crystal regions become parallel to the surface. In addition, a free space is located above the surface of the In—Ga—Zn—O film and crystals do not grow upward in the free space. As for these facts, the fact that when the In—Ga—Zn—O film was measured with thermal desorption spectroscopy (TDS) while the temperature was increased to 450° C., peaks of In and Ga were not detected but a peak of zinc was detected in a vacuum heating condition, particularly at around 300° C. is observed. Note that the TDS measurement was performed in a vacuum and it was observed that zinc was detected from around 200° C.

Note that in the first heat treatment, it is preferable that water, hydrogen, and the like be not contained in nitrogen, oxygen or a rare gas such as helium, neon, or argon. In addition, nitrogen, oxygen, or a rare gas such as helium, neon, or argon which is introduced into a heat treatment apparatus preferably has a purity of 6 N (99.9999%) or higher, more preferably 7 N (99.99999%) or higher (that is, the concentration of an impurity is lower than or equal to 1 ppm, preferably lower than or equal to 0.1 ppm). Further, the first heat treatment may be performed in an ultra-dry air atmosphere in which the content of water is lower than or equal to 20 ppm, preferably lower than or equal to 1 ppm, more preferably lower than or equal to 10 ppb.

In this embodiment, heat treatment in a dry air atmosphere at 700° C. for 1 hour is performed as the first heat treatment.

In addition, at the time of increasing the temperature in the first heat treatment, an atmosphere of a furnace may be a nitrogen atmosphere and the atmosphere may be switched to an oxygen atmosphere at the time of performing cooling. The inside portion of the first oxide semiconductor film can be supplied with oxygen so as to be an i-type oxide semiconductor film by switching the atmosphere to the oxygen atmosphere after the dehydration or dehydrogenation is performed in the nitrogen atmosphere.

Note that the heat treatment apparatus for the first heat treatment is not limited to a particular apparatus, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

Figure 9C:
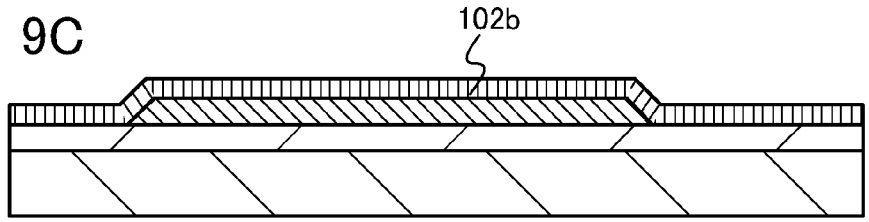
Figure 9D:
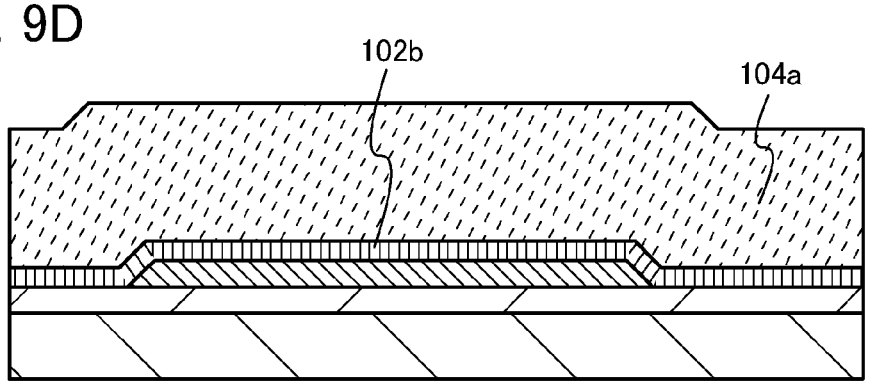

Next, over the first oxide semiconductor film 102b which has the flat-plate-shaped polycrystalline region at least at the surface thereof, a second oxide semiconductor film 104a whose thickness is larger than that of the first oxide semiconductor film 102b is formed (see FIG. 9D). The thickness of the second oxide semiconductor film 104a is greater than or equal to 1 µm, preferably greater than or equal to 3 µm, more preferably greater than or equal to 10 µm. The second oxide semiconductor film 104a can be formed by a sputtering method in a rare gas (typically, argon) atmosphere, an oxygen atmosphere, or an atmosphere including a rare gas (typically, argon) and oxygen.

As the second oxide semiconductor film 104a, any one of the following metal oxide films can be used: a four-component metal oxide film such as an In—Sn—Ga—Zn—O film; a three-component metal oxide film such as an In—Ga—Zn—O film, an In—Sn—Zn—O film, an In—Al—Zn—O film, a Sn—Ga—Zn—O film, an Al—Ga—Zn—O film, and a Sn—Al—Zn—O film; a two-component metal oxide film such as an In—Zn—O film, a Sn—Zn—O film, an Al—Zn—O film, a Zn—Mg—O film, a Sn—Mg—O film, and an In—Mg—O film; an In—O film; a Sn—O film; and a Zn—O film.

Further, it is preferable that a material of the first oxide semiconductor film and that of the second oxide semiconductor film 104a contain the same components. In the case of using the materials containing the same components, crystal growth is easily caused with the use of the polycrystalline region of the first oxide semiconductor film as a seed crystal in crystallization which is performed later. In addition, when the materials contain the same components, physical properties of an interface such as adhesion or electrical characteristics are favorable.

After that, by performing second heat treatment, crystal growth is caused with the use of the single crystal region of the first oxide semiconductor film 102b as a seed crystal. The second heat treatment is performed at a temperature higher than or equal to 450° C. and lower than or equal to 850° C., preferably higher than or equal to 600° C. and lower than or equal to 700° C. Heating time is greater than or equal to 1 minute and less than or equal to 24 hours. By the second heat treatment, the second oxide semiconductor film 104a is crystallized. Thus, an oxide semiconductor film 108 (also referred to as a second oxide semiconductor film having crystallinity) which has a polycrystalline region can be obtained (see FIG. 9E). At this time, it is preferable that crystals in the oxide semiconductor film 108 have the same structure and close lattice constants (lattice mismatch is less than or equal to 1%). Note that the oxide semiconductor film 108 includes the first oxide semiconductor film and the second oxide semiconductor film. When the second heat treatment is performed at a temperature higher than or equal to 450° C. and lower than or equal to 850° C., preferably higher than or equal to 600° C. and lower than or equal to 700° C., crystal growth can be caused in the second oxide semiconductor film 104a (also referred to as epitaxial growth or axial growth) so that a crystal axis in the crystal growth in the second oxide semiconductor film 104a and a crystal axis of the first oxide semiconductor film 102b are substantially identical. Further, epitaxial or axial growth can be caused in the second oxide semiconductor film 104a by solid phase growth.

Figure 9E:
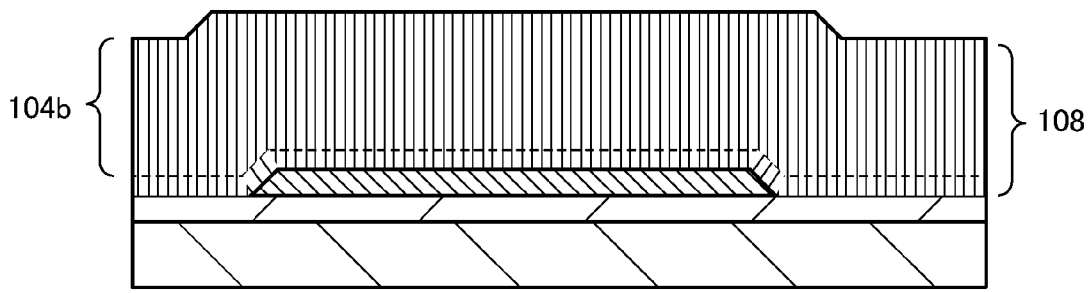

The steps illustrated in FIGS. 9C to 9E are specifically described with reference to FIG. 12A to 12C.

Figure 12A:
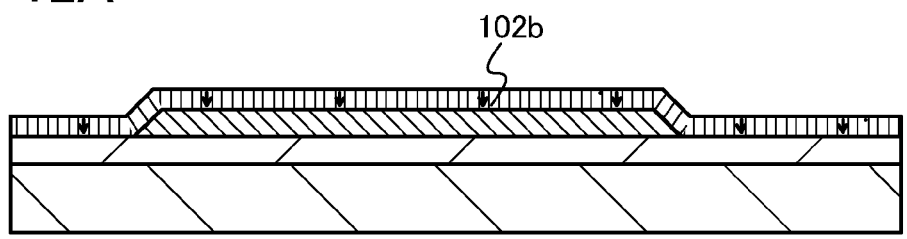
FIGS. 12A to 12C are cross-sectional views illustrating the method for manufacturing the transistor.
Figure 12B:
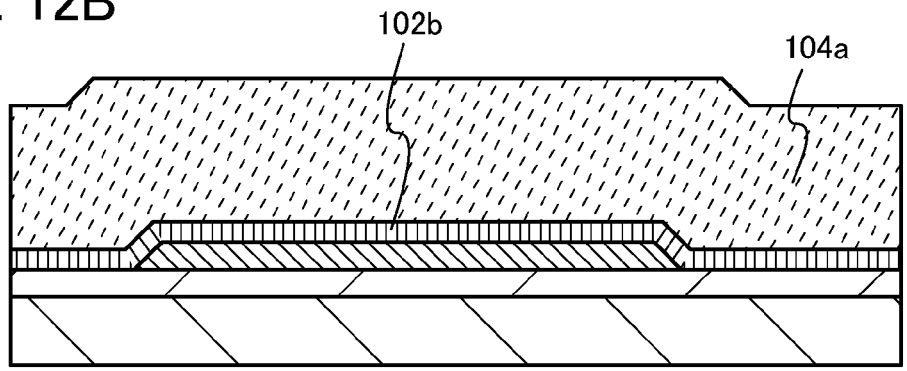
Figure 12C:
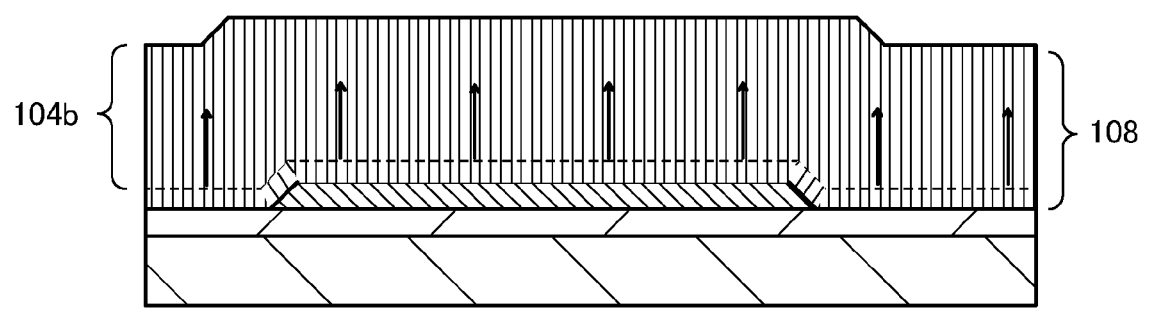

In FIG. 12A, the first oxide semiconductor film 102b after being subjected to the first heat treatment for crystallization is illustrated. FIG. 12A corresponds to FIG. 9C. FIG. 12B, which corresponds to FIG. 9D, is a cross-sectional view of the second oxide semiconductor film 104a just after being deposited. FIG. 12C, which corresponds to FIG. 9E, is a cross-sectional view after the second heat treatment. By the second heat treatment, the oxide semiconductor film 108 which has a polycrystalline region having higher alignment can be obtained. In the case where an oxide semiconductor material of the first oxide semiconductor film and that of the second oxide semiconductor film contain the same main components, as illustrated in FIG. 12C, upward crystal growth proceeds to the surface of the second oxide semiconductor film 104b with the use of the single crystal region of the first oxide semiconductor film 102b as a seed crystal, so that the second oxide semiconductor film 104b is formed, and the oxide semiconductor films have the same crystal structure. Therefore, although indicated by a dotted line in FIG. 12C, a boundary between the first oxide semiconductor film and the second oxide semiconductor film may become unclear. Furthermore, by the second heat treatment, the inside portion of the second oxide semiconductor film 104b just after deposition is highly purified.

Note that the second heat treatment is performed in a nitrogen atmosphere, an oxygen atmosphere, or a rare gas atmosphere such as helium, neon, or argon. At this time, it is preferable that water, hydrogen, and the like be not contained in nitrogen, oxygen or a rare gas such as helium, neon, or argon. In addition, nitrogen, oxygen, or a rare gas such as helium, neon, or argon which is introduced into a heat treatment apparatus preferably has a purity of 6 N or higher, more preferably 7 N or higher (that is, the concentration of an impurity is lower than or equal to 1 ppm, preferably lower than or equal to 0.1 ppm). Further, the second heat treatment may be performed in an ultra-dry air atmosphere in which the content of water is lower than or equal to 20 ppm, preferably lower than or equal to 1 ppm. In addition, at the time of increasing the temperature in the second heat treatment, an atmosphere of a furnace may be a nitrogen atmosphere and the atmosphere may be switched to an oxygen atmosphere at the time of performing cooling.

Note that the heat treatment apparatus for the second heat treatment is not limited to a particular apparatus, and the apparatus may be provided with a device for heating an object to be processed by heat radiation or heat conduction from a heating element such as a resistance heating element. For example, an electric furnace, or an RTA apparatus such as a GRTA apparatus or an LRTA apparatus can be used.

Next, after a resist mask is formed in a photolithography step over the oxide semiconductor film 108 including the first and second oxide semiconductor films, the oxide semiconductor film 108 is etched using the resist mask, whereby the island-shaped oxide semiconductor film 107 is formed. The resist mask for forming the island-shaped oxide semiconductor film 107 may be formed by an ink-jet method. No photomask is used when a resist mask is formed by an ink-jet method; therefore, production cost can be reduced. The angle formed between the first electrode 105 and the end portions of the second electrode 109 and the oxide semiconductor film 107 is set to greater than or equal to 30° and less than or equal to 60°, preferably greater than or equal to 40° and less than or equal to 50° by this etching, whereby the coverage with the gate insulating film that is formed later can be improved.

Note that the etching of the oxide semiconductor film here may be performed by dry etching, wet etching, or both wet etching and dry etching. In order to form the oxide semiconductor film 107 with a desired shape, the etching conditions (an etchant, etching time, temperature, and the like) are adjusted as appropriate depending on the material.

When the etching rate of the oxide semiconductor film is different from that of the first electrode 105, a condition such that the etching rate of the first electrode 105 is low and the etching rate of the oxide semiconductor film is high is selected.

As an etchant used for wet etching of the oxide semiconductor film, a mixed solution of phosphoric acid, acetic acid, and nitric acid, an ammonia hydrogen peroxide mixture (hydrogen peroxide water at 31 wt %: ammonia water at 28 wt %: water=5:2:2), or the like can be used. In addition, ITO07N (produced by KANTO CHEMICAL CO., INC.) may also be used.

The etchant after the wet etching is removed together with the etched materials by cleaning. The waste liquid including the etchant and the material etched off may be purified and the material may be reused. Materials such as indium contained in the oxide semiconductor film are collected from the waste liquid after the etching and recycled, so that resources can be effectively used and cost can be reduced.

As an etching gas used for dry etching of the oxide semiconductor film, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching conditions (the amount of electric power applied to a coil-shaped electrode, the amount of electric power applied to an electrode on a substrate side, the temperature of the electrode on the substrate side, or the like) are adjusted as appropriate.

Figure 10A:
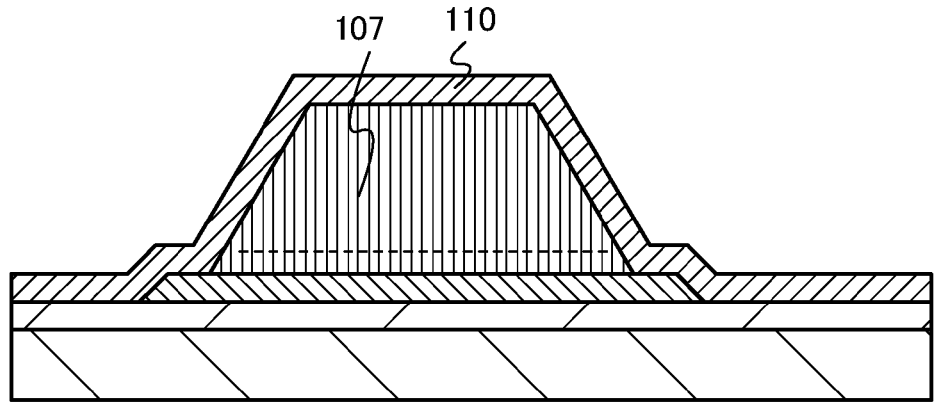
FIGS. 10A to 10C are cross-sectional views illustrating the method for manufacturing the transistor.

Then, over the insulating film, the first electrode 105, and the island-shaped oxide semiconductor film 107, a conductive film 110 to be the second electrode 109 is formed (see FIG. 10A). The conductive film 110 serves as the second electrode 109 later. The conductive film 110 can be formed by appropriately using the material and method for the first electrode 105; when a material having an etching rate which is higher than that of the first electrode 105 is used, a later etching step can be easily performed.

Figure 10B:
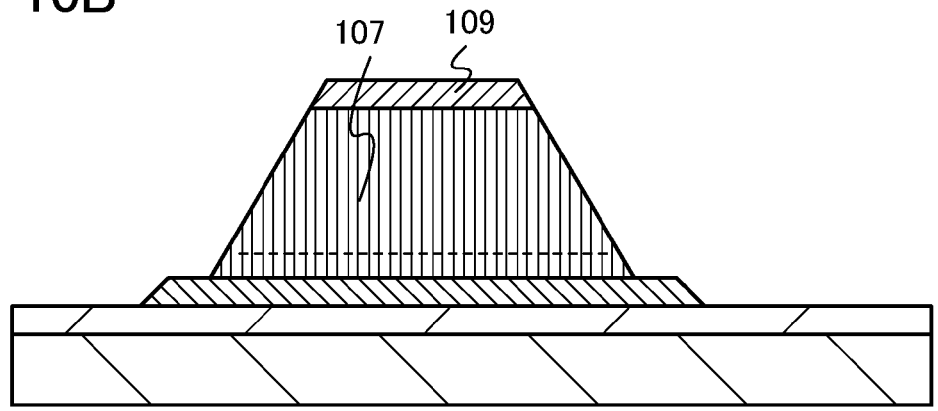

After that, a resist mask is formed in a photolithography step over the conductive film 110 and then the conductive film 110 is etched with the use of the resist mask so that the second electrode 109 is formed (see FIG. 10B).

In this embodiment, the conductive film to be the second electrode 109 is etched using an ammonia hydrogen peroxide solution (a mixed solution of ammonia, water, and a hydrogen peroxide solution) as an etchant; accordingly, the second electrode 109 is formed.

Note that the etching of the conductive film 110 here may be performed by dry etching, wet etching, or both wet etching and dry etching. In order to form the second electrode 109 with a desired shape, the etching conditions (an etchant, etching time, temperature, and the like) are adjusted as appropriate depending on the material.

Figure 10C:
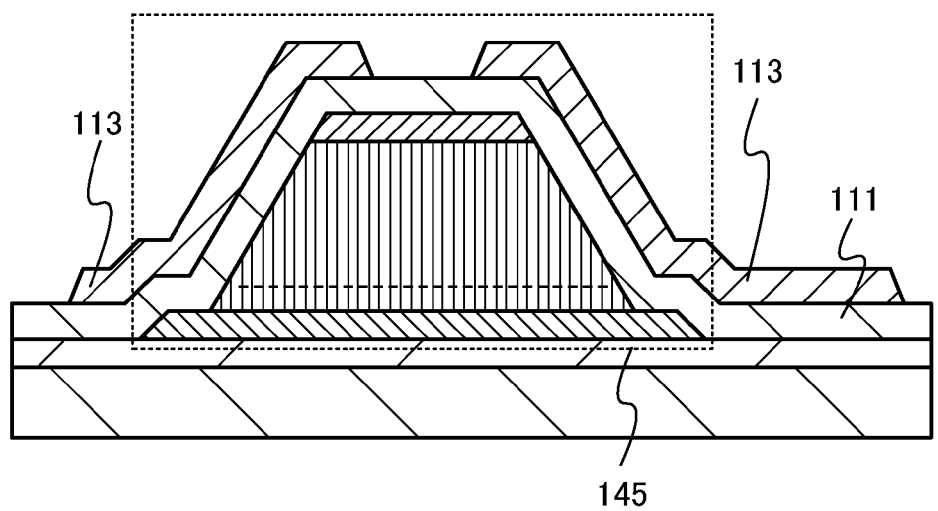

Next, as illustrated in FIG. 10C, the gate insulating film 111 is formed over the first electrode 105, the oxide semiconductor film 107, and the second electrode 109.

An oxide semiconductor film (an oxide semiconductor film in which hydrogen concentration is reduced and purity is improved) which is made intrinsic or substantially intrinsic by removal of an impurity is highly sensitive to an interface state and interface charge; thus, an interface between the oxide semiconductor film and the gate insulating film 111 is important. Therefore, the gate insulating film 111 which is in contact with the highly purified oxide semiconductor film needs high quality.

For example, a high-density plasma CVD apparatus with use of microwaves (2.45 GHz) is preferably employed because formation of a dense and high-quality insulating film having high withstand voltage is possible. This is because when the oxide semiconductor film in which hydrogen concentration is reduced and purity is improved is closely in contact with the high-quality gate insulating film, the interface state can be reduced and interface properties can be favorable. In addition, since the insulating film formed using the high-density plasma CVD apparatus can have a uniform thickness, the insulating film has excellent step coverage. In addition, as for the insulating film formed using the high-density plasma CVD apparatus, the thickness of a thin film can be controlled precisely.

Needless to say, when an insulating film that is favorable as a gate insulating film can be formed, other film formation methods such as a sputtering method and a plasma CVD method can be employed. In addition, any insulating film can be used as long as film quality and interface properties between the oxide semiconductor film and the gate insulating film are modified by heat treatment performed after formation of the gate insulating film. In any case, any insulating film may be used as long as the insulating film has characteristics of enabling reduction in interface state density of an interface between the insulating film and the oxide semiconductor film and formation of a favorable interface as well as having favorable film quality as a gate insulating film.

In a gate-bias thermal stress test (BT test) at 85° C. and $2 \times 10^6$ V/cm for 12 hours, if an impurity is added to an oxide semiconductor film, the bond between the impurity and the main component of the oxide semiconductor film is broken by a high electric field (B: bias) and high temperature (T: temperature), so that a generated dangling bond induces a drift in the threshold voltage ($V_{th}$).

In contrast, the present invention makes it possible to obtain a transistor which is stable to a BT test by removing an impurity in an oxide semiconductor film, especially hydrogen, water, and the like as much as possible to obtain a favorable characteristic of an interface between the oxide semiconductor film and a gate insulating film as described above.

Note that when the gate insulating film 111 is formed by sputtering, the hydrogen concentration in the gate insulating film 111 can be reduced. In the case where a silicon oxide film is formed by sputtering, a silicon target or a quartz target is used as a target and oxygen or a mixed gas of oxygen and argon is used as a sputtering gas.

Note that a halogen element (e.g. fluorine or chlorine) is contained in an insulating film provided in contact with the oxide semiconductor film, or a halogen element is contained in an oxide semiconductor film by plasma treatment in a gas atmosphere containing a halogen element in the state where the oxide semiconductor film is exposed, whereby an impurity such as hydrogen, water, hydroxy group, or hydride (also referred to as hydrogen compounds) existing in the oxide semiconductor film or at the interface between the oxide semiconductor film and the insulating film which is provided in contact with the oxide semiconductor film may be removed. When the insulating film contains a halogen element, the halogen element concentration in the insulating film may be approximately $5 \times 10^{18}$ $cm^{-3}$ to $1 \times 10^{20}$ $cm^{-3}$.

As described above, in the case where a halogen element is contained in the oxide semiconductor film or at the interface between the oxide semiconductor film and the insulating film which is in contact with the oxide semiconductor film and where the insulating film which is provided in contact with the oxide semiconductor film is an oxide insulating film, the oxide insulating film on the side where the oxide semiconductor film is not in contact with the oxide insulating film is preferably covered with a nitrogen insulating film. That is, a silicon nitride film or the like may be provided on and in contact with the oxide insulating film which is in contact with the oxide semiconductor film. With such a structure, an impurity such as hydrogen, water, hydroxy group, or hydride can be prevented from entering the oxide insulating film.

The gate insulating film 111 can have a structure in which a silicon oxide film and a silicon nitride film are stacked in that order over the first electrode 105, the oxide semiconductor film 107, and the second electrode 109. For example, a gate insulating film having a total thickness of 100 nm may be formed in such a manner that a silicon oxide film ($SiO_x$ (x>0)) with a thickness greater than or equal to 5 nm and less than or equal to 300 nm is formed as a first gate insulating film and a silicon nitride film ($SiN_y$ (y>0)) with a thickness greater than or equal to 50 nm and less than or equal to 200 nm is stacked over the first gate insulating film as a second gate insulating film by sputtering. In this embodiment, a 100-nm-thick silicon oxide film is formed by RF sputtering in the following conditions: the pressure is 0.4 Pa; the high-frequency power is 1.5 kW; and an atmosphere containing oxygen and argon (the flow ratio of oxygen to argon is 1:1 (each flow rate is 25 sccm)) is used.

Further, preheat treatment is preferably performed before the gate insulating film 111 is formed, in order to remove moisture or hydrogen which remains on an inner wall of a sputtering apparatus, on a surface of the target, or inside a target material. After the preheat treatment, the substrate or the sputtering apparatus is cooled. Then, the gate insulating film 111 is formed without exposure to the air. Although a certain level of effect can be obtained when introduction and exhaust of nitrogen are repeated without heating, it is more preferable to perform the treatment with the inside of the film formation chamber heated.

Next, third heat treatment (preferably at a temperature higher than or equal to 200° C. and lower than or equal to 400° C., for example, higher than or equal to 250° C. and lower than or equal to 350° C.) may be performed in an inert gas atmosphere or an oxygen gas atmosphere. By the heat treatment, oxygen is supplied to an oxygen deficiency generated by the first and second heat treatment, so that it is possible to further reduce the oxygen deficiency which serves as a donor, satisfy the stoichiometric proportion, and make the oxide semiconductor film 107 closer to an i-type oxide semiconductor film or a substantially i-type oxide semiconductor film. Note that the third heat treatment may be performed after formation of any of the following: the third electrode 113, the insulating film 117, and the wirings 125 and 129. By the heat treatment, it is possible to diffuse hydrogen or moisture contained in the oxide semiconductor film into the gate insulating film.

Then, the third electrode 113 functioning as a gate electrode is formed over the gate insulating film 111.

The third electrode 113 can be formed in such a manner that a conductive film to be the third electrode 113 is formed over the gate insulating film 111 by a sputtering method, a CVD method, or a vacuum evaporation method, a resist mask is formed over the conductive film in a photolithography step, and the conductive film is etched using the resist mask.

Through the above process, the transistor 145 including the oxide semiconductor film 107 which is highly purified and whose hydrogen concentration is reduced can be manufactured.

Figure 11A:
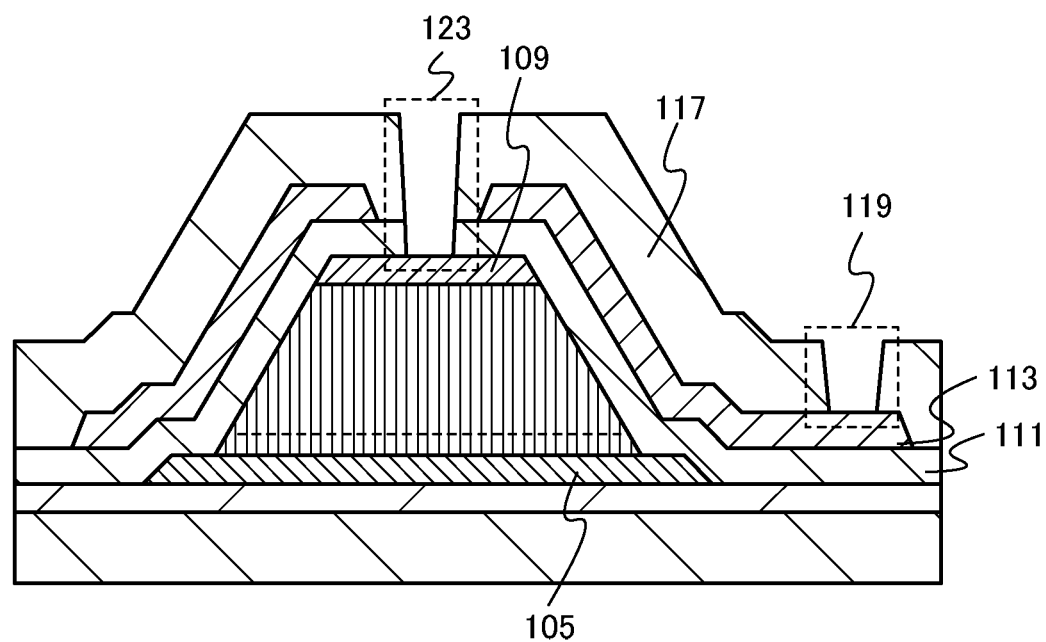
FIGS. 11A and 11B are cross-sectional views illustrating the method for manufacturing the transistor.

Next, as illustrated in FIG. 11A, after the insulating film 117 is formed over the gate insulating film 111 and the third electrode 113, contact holes 119 and 123 are formed.

The insulating film 117 is formed using an oxide insulating film such as a silicon oxide film, a silicon oxynitride film, an aluminum oxide film, or an aluminum oxynitride film; or a nitride insulating film such as a silicon nitride film, a silicon nitride oxide film, an aluminum nitride film, or an aluminum nitride oxide film. Alternatively, an oxide insulating film and a nitride insulating film can be stacked.

The insulating film 117 is formed by a sputtering method, a CVD method, or the like. Note that when the insulating film 117 is formed by a sputtering method, the substrate 101 is heated to a temperature of 100° C. to 400° C., a sputtering gas in which hydrogen, water, hydroxy group, hydride, or the like is removed and which contains high-purity nitrogen is introduced, and an insulating film may be formed using a silicon semiconductor target. Also in this case, an insulating film is preferably formed while hydrogen, water, hydroxy group, hydride, or the like remaining in the treatment chamber is removed.

After the formation of the insulating film 117, heat treatment may be further performed at a temperature higher than or equal to 100° C. and lower than or equal to 200° C. in the air for greater than or equal to 1 hour and less than or equal to 30 hours. With this heat treatment, a normally-off transistor can be obtained. Thus, the reliability of a display device or a semiconductor device can be increased.

A resist mask is formed in a photolithography step, and parts of the gate insulating film 111 and the insulating film 117 are removed by selective etching, whereby the contact holes 119 and 123 which reach the first electrode 105, the second electrode 109, and the third electrode 113 are formed.

Figure 11B:
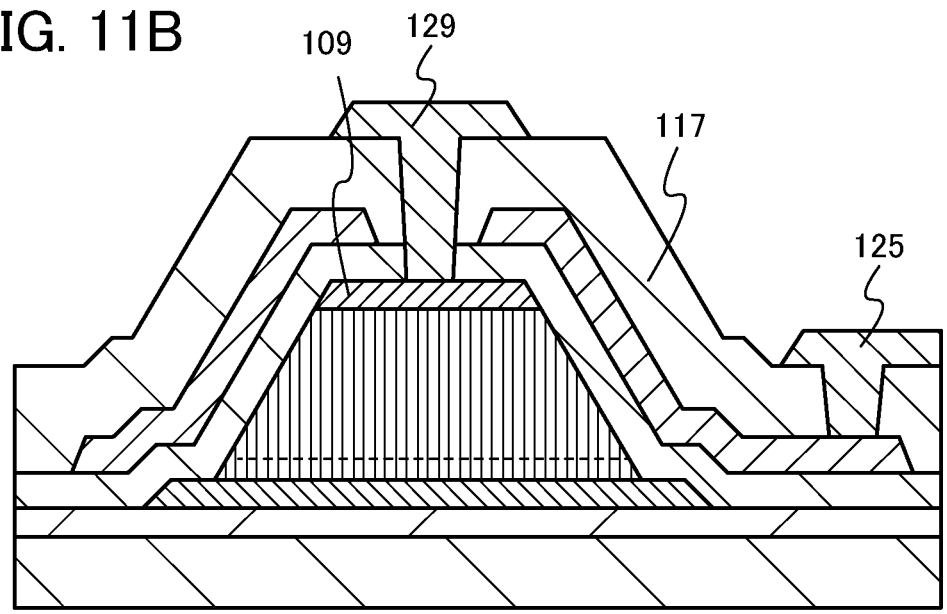

Next, after a conductive film is formed over the gate insulating film 111 and the contact holes 119 and 123, etching is performed using a resist mask formed in a photolithography step, whereby the wirings 125, 129, and 131 are formed (see FIG. 11B). Note that a resist mask may be formed by an ink-jet method. No photomask is used when a resist mask is formed by an ink-jet method; therefore, production cost can be reduced.

The wirings 125, 129, and 131 can be formed in a manner similar to that of the first electrode 105.

Note that a planarization insulating film for planarization may be provided between the third electrode 113 and the wirings 125, 129, and 131. An organic material having heat resistance, such as polyimide, acrylic, benzocyclobutene, polyamide, or epoxy can be given as typical examples of the planarization insulating film. Other than such organic materials, it is also possible to use a low-dielectric constant material (a low-k material), a siloxane-based resin, phosphosilicate glass (PSG), borophosphosilicate glass (BPSG), or the like. Note that the planarization insulating film may be formed by stacking a plurality of insulating films formed using these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method for forming the planarization insulating film. The planarization insulating film can be formed, depending on the material, by a method such as sputtering, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater.

As described above, the hydrogen concentration in the oxide semiconductor film can be reduced, the oxide semiconductor film can be highly purified, and the crystallinity of the oxide semiconductor film can be improved. Thus, the oxide semiconductor film can be stabilized. In addition, heat treatment at a temperature of lower than or equal to the glass transition temperature makes it possible to form an oxide semiconductor film with a wide band gap in which carrier density is extremely low. Therefore, a transistor can be manufactured using a large-sized substrate, so that productivity can be increased. In addition, by using the oxide semiconductor film in which the hydrogen concentration is reduced and purity is improved, it is possible to manufacture a transistor with high withstand voltage, a reduced short-channel effect, and a high on-off ratio.

Embodiment 6 can be implemented in appropriate combination with the structures described in the other embodiments.

Embodiment 7

In this embodiment, a method for manufacturing a transistor having a structure different from that of Embodiment 6 will be described with reference to FIGS. 9A to 9E and FIGS. 13A to 13C. This embodiment and Embodiment 6 are different in a step of forming the conductive film to be the second electrode 109.

Similarly to Embodiment 6, through the steps illustrated in FIGS. 9A to 9D, over the substrate 101, the insulating film 103, the first electrode 105, the first oxide semiconductor film 102b having a polycrystalline region at least on the surface thereof formed by the first heat treatment, and the second oxide semiconductor film 104a are formed.

Figure 13A:
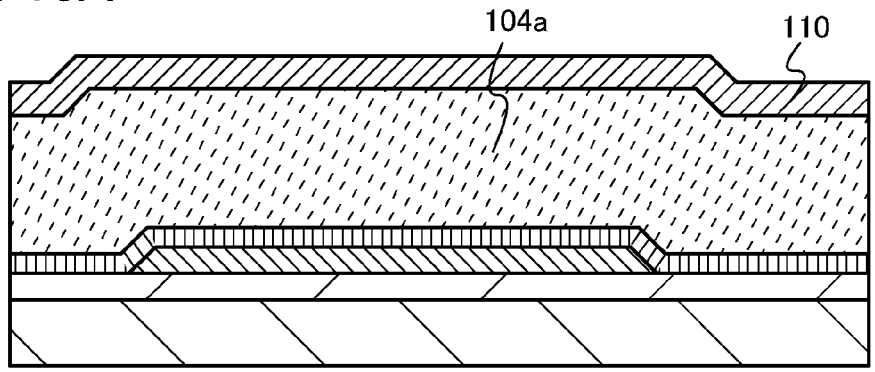
FIGS. 13A to 13C are cross-sectional views illustrating a method for manufacturing a transistor.
Figure 13B:
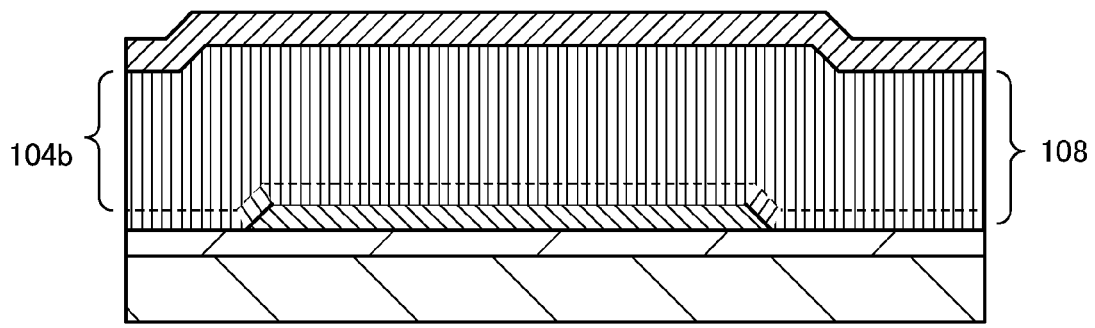

Then, as illustrated in FIG. 13A, the conductive film 110 to be the second electrode 109 is formed over the second oxide semiconductor film 104a. Here, the conductive film 110 is formed using a metal element melting point of which is higher than or equal to 1000° C. Typical examples of a material for the conductive film 110 include molybdenum, tungsten, titanium, tantalum, niobium, iridium, vanadium, chromium, zirconium, platinum, palladium, scandium, iron, yttrium, cobalt, nickel, manganese, and gold.

After that, by performing the second heat treatment, crystal growth is caused with the use of the polycrystalline region of the first oxide semiconductor film 102b as a seed crystal. The second heat treatment is performed at a temperature higher than or equal to 450° C. and lower than or equal to 850° C., preferably higher than or equal to 600° C. and lower than or equal to 700° C. By the second heat treatment, the second oxide semiconductor film 104a is crystallized so that the oxide semiconductor film 108 can be obtained.

Figure 13C:
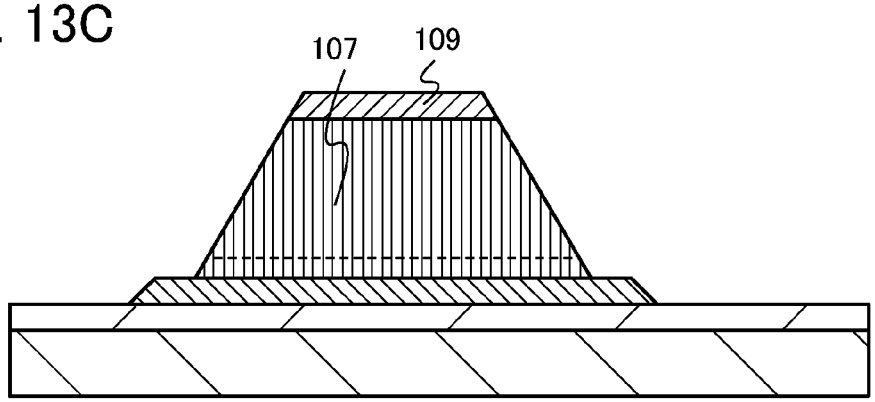

After that, a resist mask is formed in a photolithography step over the conductive film 110 and then the conductive film 110 is etched with the use of the resist mask so that the island-shaped oxide semiconductor film 107 and the second electrode 109 are formed (see FIG. 13C).

After that, through the steps described in Embodiment 6 with reference to FIG. 10C and FIGS. 11A and 11B, the transistor 145 can be manufactured.

Embodiment 7 can be implemented in appropriate combination with the structures described in the other embodiments.

Embodiment 8

In this embodiment, a method for manufacturing a transistor having a structure different from those of Embodiments 6 and 7 will be described with reference to FIGS. 9A to 9E and FIGS. 14A and 14B. This embodiment and Embodiments 6 and 7 are different in a step of forming the second oxide semiconductor film.

Figure 14A:
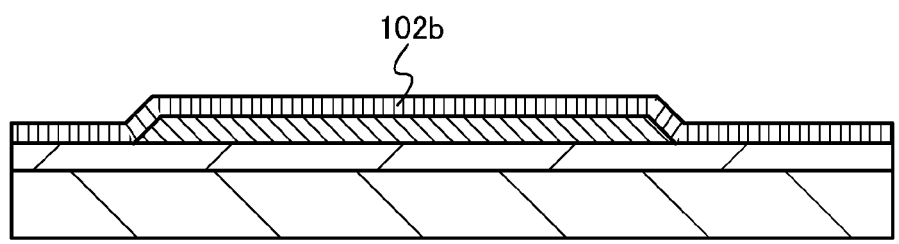
FIGS. 14A and 14B are cross-sectional views illustrating a method for manufacturing a transistor.

Similarly to Embodiment 6, through the steps illustrated in FIGS. 9A to 9C, over the substrate 101, the insulating film 103, the first electrode 105, and the first oxide semiconductor film 102b having a polycrystalline region at least on the surface thereof formed by the first heat treatment are formed as illustrated in FIG. 14A.

Figure 14B:
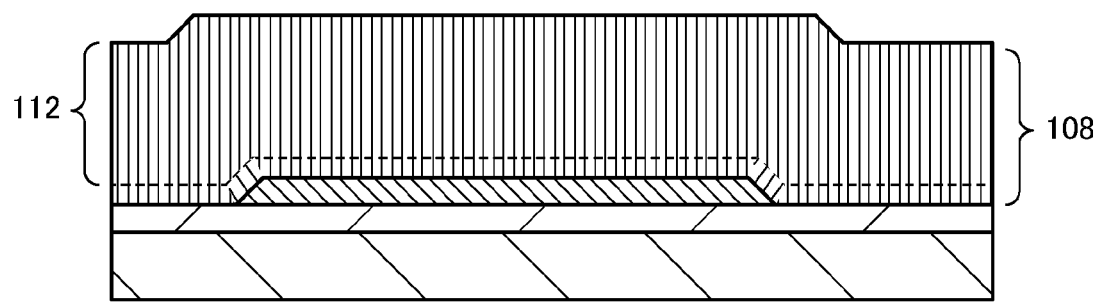

After that, as illustrated in FIG. 14B, a second oxide semiconductor film 112 is deposited over the first oxide semiconductor film 102b by a sputtering method while heating is performed at a temperature higher than or equal to 200° C. and lower than or equal to 600° C., preferably higher than or equal to 200° C. and lower than or equal to 550° C. Here, the second oxide semiconductor film 112 is deposited while crystal growth is caused with the use of the polycrystalline region at the surface of the first oxide semiconductor film 102b as a seed crystal so that the direction of a crystal axis (the c-axis, in particular) of the first oxide semiconductor film 102b and that of the second oxide semiconductor film 112 are identical (the crystal growth also referred to as epitaxial growth or axial growth). As a result, without the second heat treatment, the crystallized oxide semiconductor film 108 whose the direction of c-axis is identical to that of the first oxide semiconductor film 102b can be formed. Note that the oxide semiconductor film 108 includes the first oxide semiconductor film 102b and the second oxide semiconductor film 112.

After that, through the steps described in Embodiment 6 or 7, the transistor 145 can be manufactured.

In this embodiment, the number of times of heat treatment can be reduced, whereby throughput can be increased.

Embodiment 8 can be implemented in appropriate combination with the structures described in the other embodiments.

Embodiment 9

In this embodiment, a mode different from Embodiments 6 to 8 is described with reference to FIGS. 15A to 15C.

An example in which the first oxide semiconductor film 102a has a thickness of 15 nm is described in this embodiment.

Figure 15A:
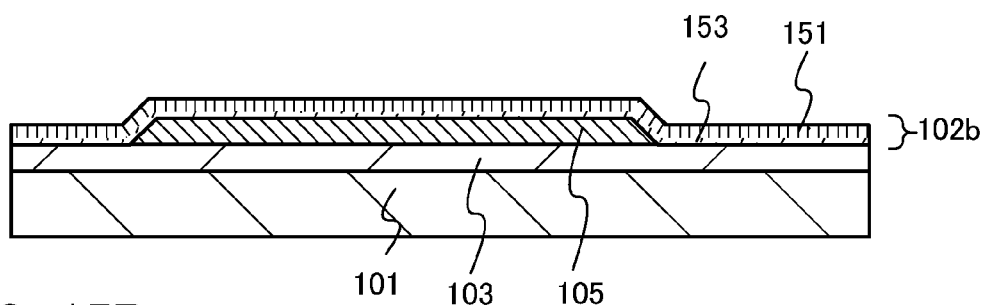
FIGS. 15A to 15C are cross-sectional views illustrating a method for manufacturing a transistor.

Although it depends on conditions such as materials of the first oxide semiconductor film 102a and the first electrode 105 that is a base member, heating time, and heating temperature, when the first oxide semiconductor film 102a has a thickness of 15 nm, the tips of crystals of a polycrystalline region 151 does not reach an interface with the first electrode 105 and an amorphous region 153 remains, even though crystal growth is caused from the surface of the first oxide semiconductor film 102b by the first heat treatment (see FIG. 15A).

Figure 15B:
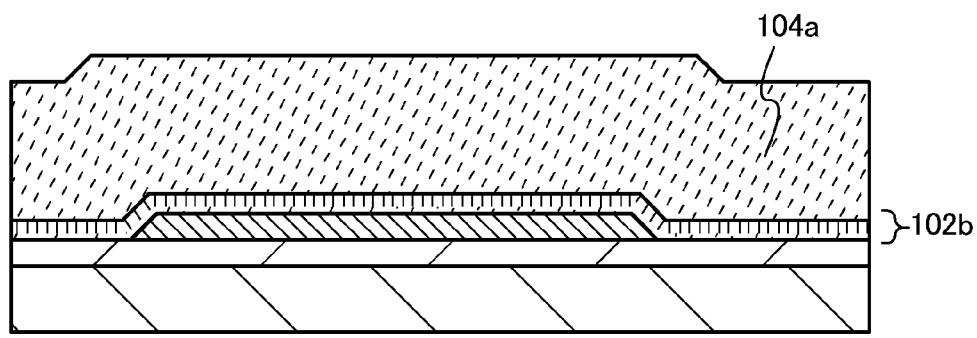
Figure 15C:
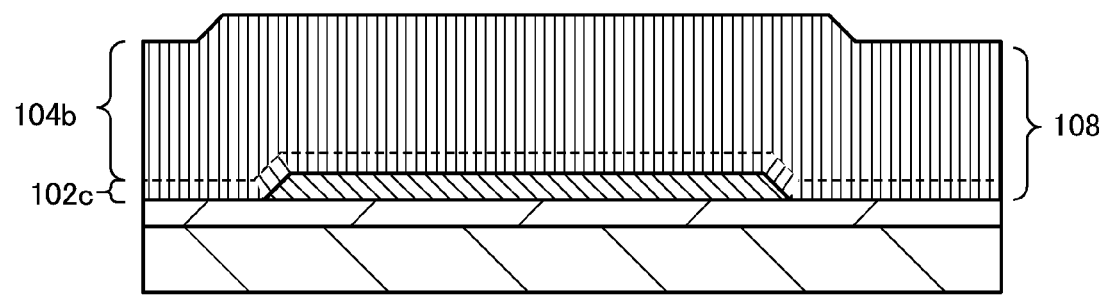

Here, FIG. 15B is a cross-sectional view just after deposition of the second oxide semiconductor film 104a over the first oxide semiconductor film 102b.

Then, the second heat treatment is performed after the second oxide semiconductor film 104a is formed. By the second heat treatment, in the first oxide semiconductor film 102b, downward crystal growth proceeds to the interface with the first electrode 105; accordingly, the first oxide semiconductor film 102b becomes a first oxide semiconductor film 102c in which crystal growth reaches the first electrode 105. In the case where an oxide semiconductor material of the first oxide semiconductor film 102c and that of the second oxide semiconductor film 104b contain the same main components, as illustrated in FIG. 15C, upward crystal growth proceeds to the surface of the second oxide semiconductor film 104b with the use of the polycrystalline region of the first oxide semiconductor film 102b as a seed crystal, so that the second oxide semiconductor film 104b is formed and the oxide semiconductor film 108 having a uniform crystal structure is formed. Therefore, although indicated by a dotted line in FIG. 15C, a boundary between the first oxide semiconductor film 102c and the second oxide semiconductor film 104b may become unclear.

In this embodiment, from the interface between the first oxide semiconductor film 102b and the second oxide semiconductor film 104a, crystal growth can proceed both upward and downward.

The conditions of the first and second heat treatment are in the range which is described in Embodiment 6. Note that when the second heat treatment is performed at a temperature higher than the first heat treatment or for a heating time longer than the first heat treatment, a single crystal region is formed at the surface of the second oxide semiconductor film 104a at the time of the second heat treatment in some cases. In the case where such a single crystal region formed at the surface of the second oxide semiconductor film 104a affects the transistor characteristics, conditions which do not allow a single crystal region to be formed at the surface of the second oxide semiconductor film 104b may be appropriately selected.

In the above description, an example in which the first oxide semiconductor film has a thickness of 15 nm is described; however, the present invention is not particularly limited thereto. Even when the first oxide semiconductor film 102b has a thickness less than or equal to 10 nm, the amorphous region 153 can remain between the single crystal region 151 of the first oxide semiconductor film 102b and the first electrode 105 by reducing the temperature of the first heat treatment or by shortening the heating time of the first heat treatment. The state illustrated in FIG. 15C can be realized by forming the single crystal region reaching the first electrode 105 by the second heat treatment. That is, by employing the process described in this embodiment, the temperature of the first heat treatment can be reduced and the heating time of the first heat treatment can be shortened.

In addition, this embodiment can be arbitrarily combined with other embodiments.

Embodiment 10

In Embodiments 6 to 9, an oxide semiconductor material of the first oxide semiconductor film and that of the second oxide semiconductor film contain the same main components; this embodiment describes the case where a component of an oxide semiconductor material of the first oxide semiconductor film is different from that of an oxide semiconductor material of the second oxide semiconductor film. Note that since FIG. 16A is the same as FIG. 9A, the same portions as those in FIG. 9A are denoted by the same reference numerals in FIG. 16A.

In this embodiment, an example in which a metal oxide target having a composition ratio of In:Zn=1:1 [atom ratio], which does not contain Ga is used and the first oxide semiconductor film has a thickness of 5 nm is described.

Figure 16A:
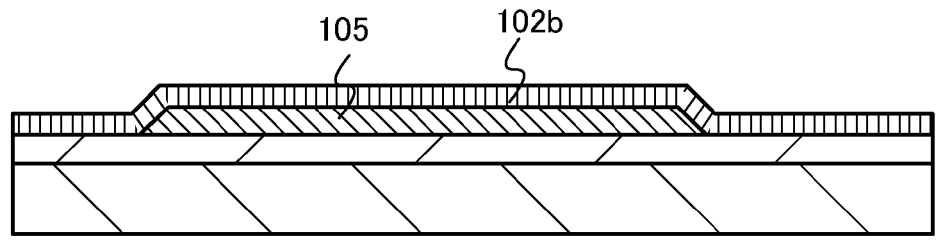
FIGS. 16A to 16C are cross-sectional views illustrating a method for manufacturing a transistor.

FIG. 16A illustrates the first oxide semiconductor film 102b over the insulating film 103 and the first electrode 105 after the first heat treatment is performed for crystallization similarly to Embodiment 6. Note that since FIG. 16A is the same as FIG. 9A, the same portions as those in FIG. 9A are denoted by the same reference numerals in FIG. 16A.

Next, the first heat treatment is performed. Crystal growth proceeds from the surface by the first heat treatment, so that the first oxide semiconductor film 102b having a polycrystalline region reaching the interface with the first electrode 105 is formed, which depends on conditions such as materials of the first oxide semiconductor film and the first electrode 105, heating time, and heating temperature (see FIG. 16A).

Crystal growth proceeds from the surface in the perpendicular direction in the first oxide semiconductor film 102b which has the polycrystalline region having relatively uniform crystal alignment at the surface. Further, the first oxide semiconductor film 102b is c-axis aligned in the direction perpendicular to the surface.

Figure 16B:
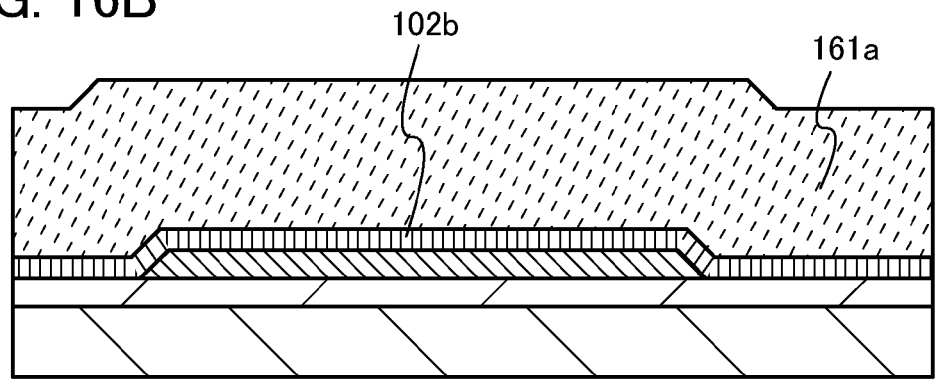

Next, FIG. 16B is a cross-sectional view just after deposition of a second oxide semiconductor film 161a over the first oxide semiconductor film 102b. When the second oxide semiconductor film is formed over the first oxide semiconductor film, a metal oxide target having a composition ratio of In:Ga:Zn=1: greater than or equal to 0 and less than or equal to 2: greater than or equal to 1 and less than or equal to 5 is used. In this embodiment, as the second oxide semiconductor film 161a, an In—Ga—Zn—O film is formed to a thickness of 1 μm using an In—Ga—Zn—O-based oxide semiconductor target (In:Ga:Zn=1:1:1 [atom ratio]).

Figure 16C:
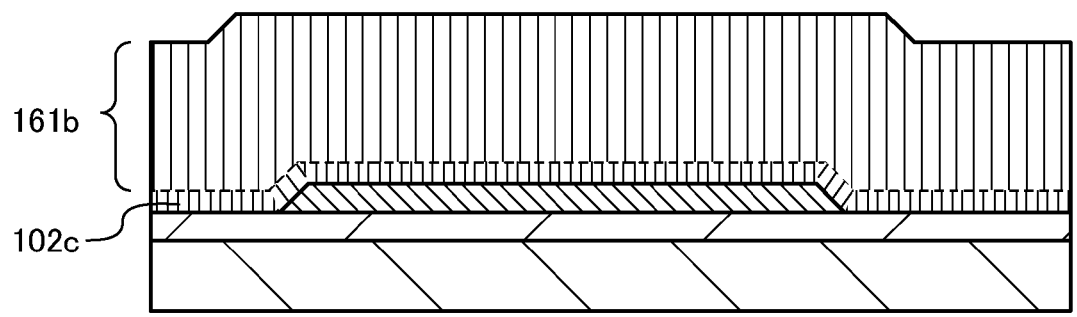

Then, the second heat treatment is performed after the second oxide semiconductor film 161a is formed. By the second heat treatment, crystal growth is caused as illustrated in FIG. 16C. As illustrated in FIG. 16C, upward crystal growth proceeds to the surface of the second oxide semiconductor film with the use of the polycrystalline region of the first oxide semiconductor film 102b as a seed crystal; accordingly, a second oxide semiconductor film 161b can be formed.

The first oxide semiconductor film 102b becomes the third oxide semiconductor film 102c whose crystallinity is further improved because the polycrystalline region obtained by the first heat treatment is heated again by the second heat treatment.

Since the component of the oxide semiconductor material of the second oxide semiconductor film 161a is different from that of the oxide semiconductor material of the first oxide semiconductor film 102b, a boundary is formed between the third oxide semiconductor film 102c and the second oxide semiconductor film 161b as illustrated in FIG. 16C. Also by the second heat treatment, most part of the first oxide semiconductor film, including part near the interface with the first electrode 105, becomes the polycrystalline region.

The structure illustrated in FIG. 16C can be referred to as a two-layer structure in which the third oxide semiconductor film 102c and the second oxide semiconductor film 161b are stacked in this order over and in contact with the first electrode 105. Upward crystal growth effectively proceeds to make the In—Ga—Zn—O film be a polycrystalline region by using the In—Zn—O film, which is crystallized more easily than an In—Ga—Zn—O film, as the seed crystal. The band gap of the third oxide semiconductor film 102c can be different from that of the second oxide semiconductor film 161b.

The conditions of the first and second heat treatment are in the range which is described in Embodiment 6.

In addition, this embodiment can be arbitrarily combined with other embodiments.

Embodiment 11

In this embodiment, a manufacturing method of a semiconductor device with high yield is described with reference to FIGS. 17A and 17B.

Figure 17A:
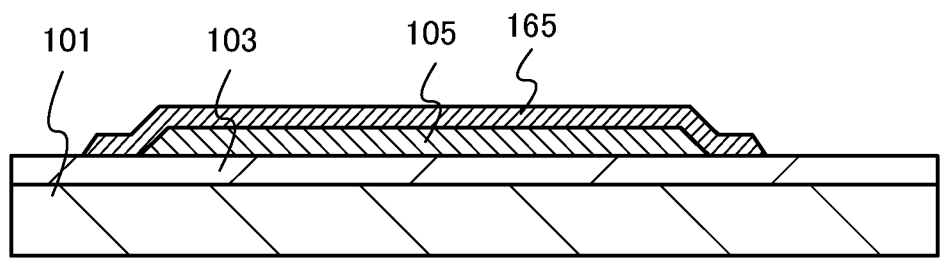
FIGS. 17A and 17B are cross-sectional views illustrating a method for manufacturing a transistor.
Figure 17B:
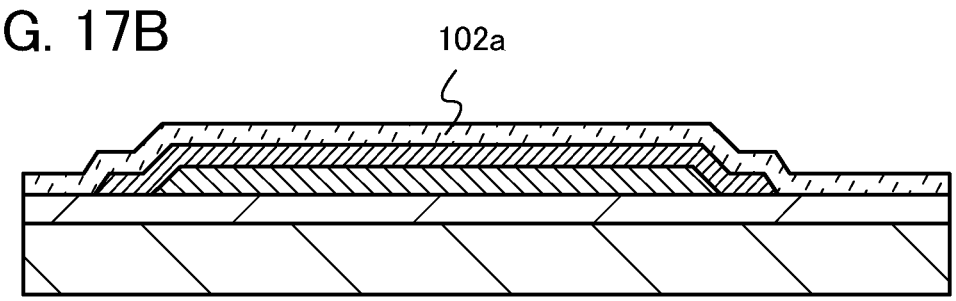

As illustrated in FIG. 17A, the insulating film 103 is formed over the substrate 101, and the first electrode 105 is formed over the insulating film 103. Then, a protective film 165 is formed over the first electrode 105. The protective film 165 is provided in order to increase adhesion of the first electrode 105 to an oxide semiconductor film to be formed later. Further, the protective film 165 is provided in order to prevent the first electrode 105 to be oxidized in a step of forming the oxide semiconductor film.

A metal nitride film having a thickness greater than or equal to 1 nm and less than or equal to 100 nm is preferably formed as the protective film 165; typically, a titanium nitride film or a tantalum nitride film is formed.

The first oxide semiconductor film 102a is then formed, whereby peeling of the first oxide semiconductor film 102a can be suppressed. In addition, the first electrode 105 can be prevented from being oxidized.

Then, the steps which are described in any of Embodiments 6 to 10 are performed; thus, a semiconductor device can be manufactured.

Embodiment 12

A mode which uses a circuit which includes the semiconductor element described in any of Embodiments 1 to 11 will be described.

A transistor and a diode, each of which is one mode of the semiconductor element described in any of Embodiments 1 to 11, have a high on-off ratio and high withstand voltage and is scarcely degraded. Thus, the transistor and diode can be used in the following examples: a home electrical appliance in which an inverter technique is applied such as an air conditioner, a refrigerator, a rice cooker, or a solar power generation system; a battery-driven portable information terminal device such as a laptop computer; a power amplifier device such as a stroboscope, an electric vehicle; a DC-DC converter circuit; a motor control circuit; an audio amplifier; a logic circuit; a switch circuit; and a high-frequency linear amplifier.

Here, an example of a solar power generation system which is provided with an inverter formed using the semiconductor element described in any of Embodiments 1 to 11 is described with reference to FIG. 18. Note that an example of a structure of a solar power generation system installed on a house and the like is described here.

Figure 18:
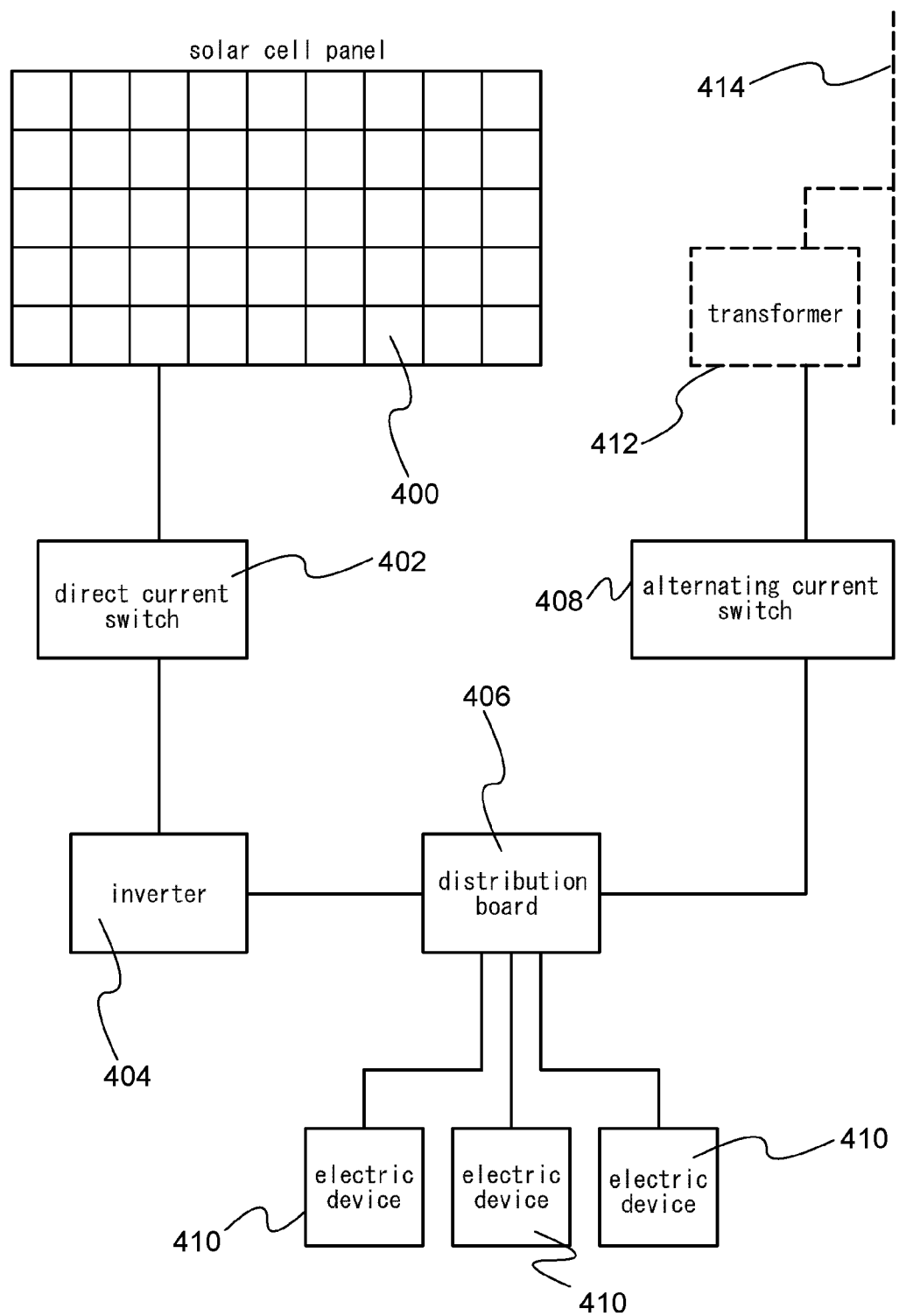
FIG. 18 is a diagram illustrating an example of a photovoltaic system.

A residential solar power generation system illustrated in FIG. 18 is a system in which a method for supplying electric power is changed in accordance with the state of solar power generation. When solar power generation is performed, for example, when the sun shines, electric power generated by solar power generation is consumed inside the house, and surplus electric power is supplied to an electric grid 414 provided by an electric power company. On the other hand, at night time or at the time of rain when electric power is insufficient, electric power is supplied from the electric grid 414 and is consumed inside the house.

The residential solar power generation system illustrated in FIG. 18 includes a solar cell panel 400 which converts sunlight into electric power (direct current power), an inverter 404 which converts the electric power from direct current into alternating current, and the like. Alternating current power output from the inverter 404 is used as electric power for operating various types of electric devices 410.

Surplus electric power is supplied to outside the house through the electric grid 414. That is, electric power can be sold using this system. A direct current switch 402 is provided to select connection or disconnection between the solar cell panel 400 and the inverter 404. An alternating current switch 408 is provided to select connection or disconnection between a distribution board 406 and a transformer 412 connected to the electric grid 414.

When the semiconductor device of the disclosed invention is applied to the above inverter, a highly reliable and inexpensive solar power generation system can be realized.

The methods and structures described in this embodiment can be combined as appropriate with any of the methods and structures described in the other embodiments.

Example 1

In Example 1, results of taking TEM photographs of a cross section of oxide semiconductor films which were crystallized by heat treatment are described with reference to FIGS. 19A and 19B and FIGS. 20A and 20B.

First, a manufacturing method of Sample A is described below.

A silicon oxynitride film (SiON) was formed over a glass substrate by a CVD method. Then, an In—Ga—Zn—O film (OS) having a thickness of 5 nm was formed over the silicon oxynitride film. At this time, the In—Ga—Zn—O film was formed in the following conditions: an oxide semiconductor target (an In—Ga—Zn—O-based oxide semiconductor target ($In_2O_3:Ga_2O_3:ZnO=1:1:2$ [molar ratio] and In:Ga:Zn=1:1:1 [atom ratio]) was used; the substrate temperature was 200° C.; the deposition rate was 4 nm/min; and the target was sputtered. Note that in the case where the above-described oxide semiconductor target is used, a crystal of $InGaZnO_4$ is easily obtained. Next, a protective film was formed over the In—Ga—Zn—O film. The In—Ga—Zn—O film formed over the glass substrate was then subjected to heat treatment in a dry air atmosphere at 700° C. for 1 hour; thus, Sample A was manufactured.

Figure 19A:
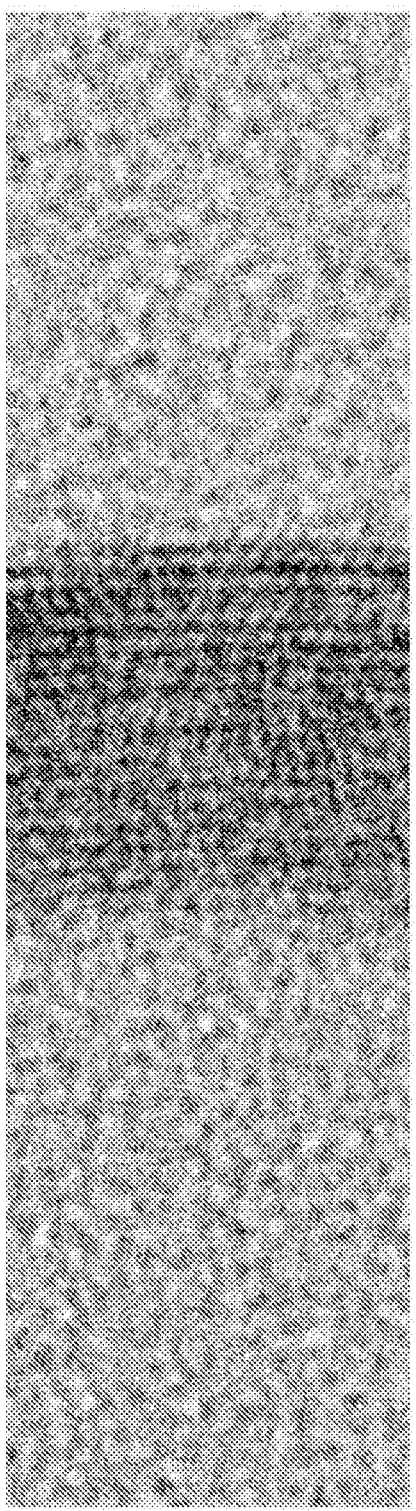
FIGS. 19A and 19B are a TEM photograph and a schematic diagram of a cross section of an oxide semiconductor film.
Figure 19B:
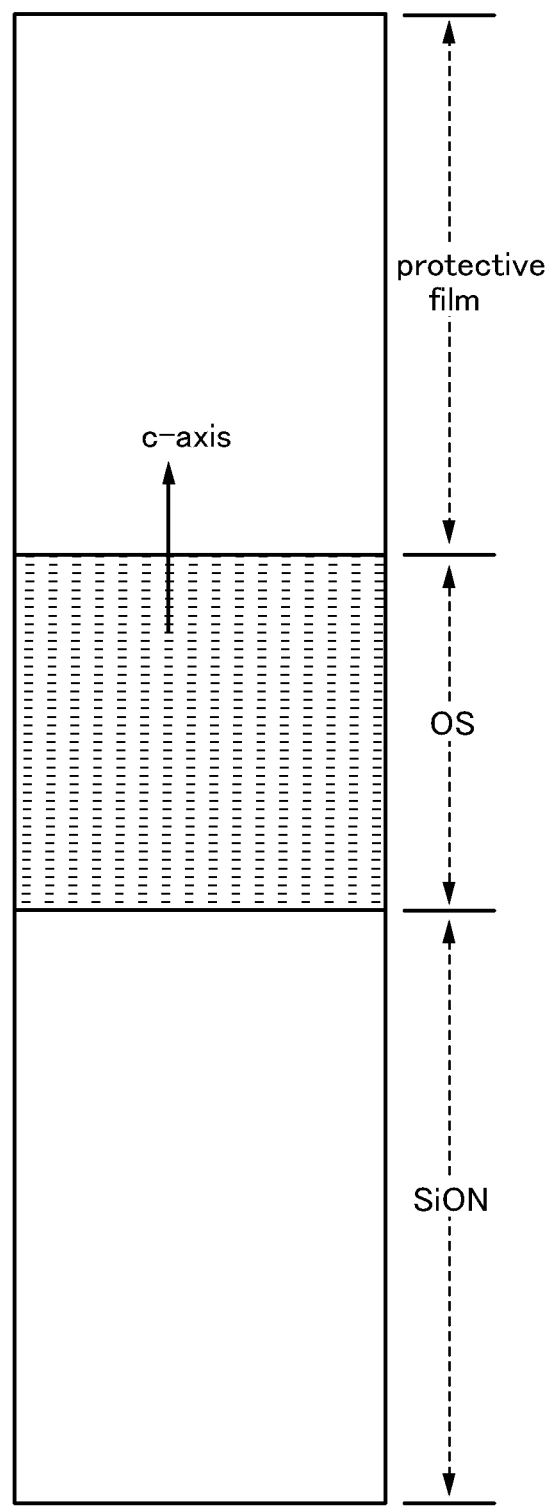

FIG. 19A is a TEM photograph of a cross section of Sample A and FIG. 19B is a schematic diagram of FIG. 19A. Note that the TEM photograph is a high magnification photograph (eight million-fold magnification) taken at an acceleration voltage of 300 kV using a high resolution transmission electron microscope ("H9000-NAR": TEM manufactured by Hitachi, Ltd.). It can be observed that the In—Ga—Zn—O film was c-axis aligned in a direction perpendicular to the surface and a region close to the interface between the silicon oxynitride film and the In—Ga—Zn—O film was also crystallized and c-axis aligned in a direction perpendicular to the surface. In other words, an oxide semiconductor film having a flat-plate-shaped polycrystalline region was formed. Note that elements which were adjacent to each other in the a-b plane were of the same kind. The c-axis direction of the flat-plate-shaped polycrystalline region corresponded to the direction perpendicular to the surface.

Next, a manufacturing method of Sample B, which is a comparative example, is described below.

A silicon oxynitride film (SiON) was formed over a glass substrate by a CVD method. Then, an In—Ga—Zn—O film having a thickness of 50 nm was formed over the silicon oxynitride film in conditions similar to those of Sample A. Next, a protective film was formed over the In—Ga—Zn—O film. After that, heat treatment was performed in a dry air atmosphere at 700° C. for 1 hour; thus, Sample B was manufactured.

FIG. 20A is a TEM photograph of a cross section of Sample B and FIG. 20B is a schematic diagram of FIG. 20A. Note that the TEM photograph is a high magnification photograph (two million-fold magnification) taken at an acceleration voltage of 300 kV using a high resolution transmission electron microscope ("H9000-NAR": TEM manufactured by Hitachi, Ltd.). It can be observed that crystallization proceeded to a depth of approximately 5 nm from the surface of the In—Ga—Zn—O film and a lot of amorphous regions and a plurality of crystals whose crystal axes were not uniformly oriented randomly existed in the inside portion of the In—Ga—Zn—O film. Therefore, it can be said that even when heat treatment at 700° C. for 1 hour, i.e., heat treatment at a temperature higher than 650° C. for a treatment time longer than 6 minutes, is performed once, a single crystal region having high alignment is hardly formed in a whole In—Ga—Zn—O film which is formed as thick as 50 nm.

From these experimental results, it can be said that a polycrystalline region having a large thickness can be formed by forming an oxide semiconductor film by the following two steps: a polycrystalline region to be a seed crystal is formed; and then crystal growth is caused after another oxide semiconductor film is formed. That is, it is shown that the method disclosed in this specification is extremely effective. Formation of an oxide semiconductor film in two steps and heat treatment performed twice make it possible to obtain a thick polycrystalline region having high alignment, i.e., a polycrystalline region having the a-b plane which is parallel to the surface of the flat-plate-shaped polycrystalline region and being c-axis aligned in a direction perpendicular to the surface of the flat-plate-shaped polycrystalline region.

This application is based on Japanese Patent Application serial no. 2009-270854 filed with Japan Patent Office on Nov. 28, 2009, the entire contents of which are hereby incorporated by reference.

What is claimed is:

1. An oxide semiconductor film on an amorphous insulating surface, the oxide semiconductor film comprising indium, zinc, a metal element other than indium and zinc, and oxygen,
    wherein the oxide semiconductor film is highly purified,
    wherein the oxide semiconductor film is intrinsic or substantially intrinsic, and
    wherein the oxide semiconductor film includes a plurality of crystalline regions, c-axes of which are substantially perpendicular to a surface of the oxide semiconductor film.

2. The oxide semiconductor film according to claim 1, wherein the metal element is gallium.

3. The oxide semiconductor film according to claim 1,
    wherein the oxide semiconductor film is provided on a silicon oxynitride, and
    wherein the silicon oxynitride includes the amorphous insulating surface.

4. An oxide semiconductor film on an amorphous insulating surface, the oxide semiconductor film comprising indium, zinc, a metal element other than indium and zinc, and oxygen,
    wherein the oxide semiconductor film includes a plurality of crystalline regions, c-axes of which are substantially perpendicular to a surface of the oxide semiconductor film, and
    wherein a concentration of iron in the oxide semiconductor film is $1.0 \times 10^{15}$ atoms/cm$^3$ or lower.

5. The oxide semiconductor film according to claim 4, wherein the metal element is gallium.

6. The oxide semiconductor film according to claim 4,
    wherein the oxide semiconductor film is provided on a silicon oxynitride, and
    wherein the silicon oxynitride includes the amorphous insulating surface.

7. An oxide semiconductor film on an amorphous insulating surface, the oxide semiconductor film comprising indium, zinc, a metal element other than indium and zinc, and oxygen,
    wherein the oxide semiconductor film includes a plurality of crystalline regions, c-axes of which are substantially perpendicular to a surface of the oxide semiconductor film, and
    wherein a concentration of nickel in the oxide semiconductor film is $1.0 \times 10^{15}$ atoms/cm$^3$ or lower.

8. The oxide semiconductor film according to claim 7, wherein the metal element is gallium.

9. The oxide semiconductor film according to claim 7,
    wherein the oxide semiconductor film is provided on a silicon oxynitride, and
    wherein the silicon oxynitride includes the amorphous insulating surface.

10. An oxide semiconductor film on an amorphous insulating surface, the oxide semiconductor film comprising indium, zinc, a metal element other than indium and zinc, and oxygen,
    wherein the oxide semiconductor film includes a plurality of crystalline regions, c-axes of which are substantially perpendicular to a surface of the oxide semiconductor film, and
    wherein a concentration of hydrogen in the oxide semiconductor film is $1.0 \times 10^{18}$ atoms/cm$^3$ or lower.

11. The oxide semiconductor film according to claim 10, wherein the metal element is gallium.

12. The oxide semiconductor film according to claim 10,
    wherein the oxide semiconductor film is provided on a silicon oxynitride, and
    wherein the silicon oxynitride includes the amorphous insulating surface.

13. An oxide semiconductor film on an amorphous insulating surface, the oxide semiconductor film comprising indium, zinc, a metal element other than indium and zinc, and oxygen,
    wherein the oxide semiconductor film includes a plurality of crystalline regions, c-axes of which are substantially perpendicular to a surface of the oxide semiconductor film, and
    wherein a concentration of an impurity imparting an n-type conductivity type to the oxide semiconductor film is reduced so that the oxide semiconductor film is intrinsic or substantially intrinsic.

14. The oxide semiconductor film according to claim 13, wherein the metal element is gallium.

15. The oxide semiconductor film according to claim 13,
    wherein the oxide semiconductor film is provided on a silicon oxynitride, and
    wherein the silicon oxynitride includes the amorphous insulating surface.

16. An oxide semiconductor film on an amorphous insulating surface, the oxide semiconductor film comprising indium, zinc, a metal element other than indium and zinc, and oxygen,
    wherein the oxide semiconductor film is highly purified,
    wherein the oxide semiconductor film includes a plurality of crystalline regions, c-axes of which are substantially perpendicular to a surface of the oxide semiconductor film, and
    wherein a density of state caused due to oxygen defects in the oxide semiconductor film is reduced so that the oxide semiconductor film is intrinsic or substantially intrinsic.

17. The oxide semiconductor film according to claim 16, wherein the metal element is gallium.

18. The oxide semiconductor film according to claim 16,
    wherein the oxide semiconductor film is provided on a silicon oxynitride, and wherein the silicon oxynitride includes the amorphous insulating surface.

19. An oxide semiconductor film on an amorphous insulating surface, the oxide semiconductor film comprising indium, zinc, a metal element other than indium and zinc, and oxygen,
- wherein the oxide semiconductor film comprises a first region and a second region over the first region,
- wherein the first region comprises an amorphous portion and a plurality of crystals, and
- wherein the second region comprises a plurality of crystalline regions, c-axes of which are substantially perpendicular to a surface of the oxide semiconductor film.

20. The oxide semiconductor film according to claim 19, wherein the metal element is gallium.

21. The oxide semiconductor film according to claim 19,
- wherein the oxide semiconductor film is provided on a silicon oxynitride, and
- wherein the silicon oxynitride includes the amorphous insulating surface.

* * * * *

UNITED STATES PATENT AND TRADEMARK OFFICE
CERTIFICATE OF CORRECTION

PATENT NO. : 8,698,138 B2
APPLICATION NO. : 13/713385
DATED : April 15, 2014
INVENTOR(S) : Shunpei Yamazaki It is certified that error appears in the above-identified patent and that said Letters Patent is hereby corrected as shown below:

In the Specification

At column 12, line 23, "n," should be --$n_i$--;

At column 13, line 6, "$\in_s, \in_0$" should be --$\varepsilon_s, \varepsilon_0$,--;

At column 13, line 14, "$\in_s$" should be --$\varepsilon_s$--;

At column 13, line 15, "$\in_s$" should be --$\varepsilon_s$--;

At column 13, line 35, "lower" should be --lower $n_i$--.

Signed and Sealed this
Ninth Day of September, 2014

Michelle K. Lee
*Deputy Director of the United States Patent and Trademark Office*